(12) United States Patent
Jin

(10) Patent No.: US 12,249,614 B2
(45) Date of Patent: Mar. 11, 2025

(54) DEPTH PIXEL HAVING MULTIPLE PHOTODIODES AND TIME-OF-FLIGHT SENSOR INCLUDING THE SAME

(71) Applicant: SAMSUNG ELECTRONICS CO., LTD., Suwon-si (KR)

(72) Inventor: Younggu Jin, Osan-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 530 days.

(21) Appl. No.: 17/375,148

(22) Filed: Jul. 14, 2021

(65) Prior Publication Data

US 2022/0165775 A1    May 26, 2022

(30) Foreign Application Priority Data

Nov. 26, 2020 (KR) .................. 10-2020-0161448

(51) Int. Cl.
*H01L 27/146* (2006.01)
*H01L 27/148* (2006.01)
*H04N 25/705* (2023.01)

(52) U.S. Cl.
CPC .. *H01L 27/14627* (2013.01); *H01L 27/14603* (2013.01); *H01L 27/14614* (2013.01); *H01L 27/1462* (2013.01); *H01L 27/14636* (2013.01); *H01L 27/14643* (2013.01); *H01L 27/14831* (2013.01); *H04N 25/705* (2023.01)

(58) Field of Classification Search
CPC ......... H01L 27/14627; H01L 27/14603; H01L 27/14614; H01L 27/1462; H01L 27/14636; H01L 27/14643; H01L 27/14831; H04N 25/705; G01S 7/4865; G01S 7/4861; G01S 17/894; G01S 7/4863; G01S 7/481; G01S 17/08
See application file for complete search history.

(56) References Cited

U.S. PATENT DOCUMENTS

| | | | |
|---|---|---|---|
| 10,468,439 B2 | 11/2019 | Ikeda et al. | |
| 11,871,134 B2* | 1/2024 | Watanabe | H04N 25/705 |
| 2012/0173184 A1 | 7/2012 | Ovsiannikov et al. | |
| 2018/0156899 A1 | 6/2018 | Yamada et al. | |
| 2018/0366504 A1* | 12/2018 | Jin | G01S 7/4816 |
| 2019/0296070 A1* | 9/2019 | Jin | H01L 27/14625 |
| 2020/0029047 A1* | 1/2020 | Jin | H01L 27/14612 |
| 2020/0111823 A1 | 4/2020 | Jin et al. | |
| 2020/0185439 A1 | 6/2020 | Jin et al. | |

* cited by examiner

*Primary Examiner* — Nilufa Rahim
(74) *Attorney, Agent, or Firm* — Muir Patent Law, PLLC

(57) ABSTRACT

A depth pixel includes a first photodiode, a second photodiode and a common microlens. First and second taps are disposed at both sides of the first photodiode in a first horizontal direction to sample a photo charge stored in the first photodiode. The second photodiode is disposed at a side of the first photodiode in a second horizontal direction perpendicular to the first horizontal direction. Third and fourth taps are disposed at both sides of the second photodiode in the first horizontal direction to sample a photo charge stored in the second photodiode. The common microlens is disposed above or below the semiconductor substrate. The common microlens covers both of the first photodiode and the second photodiode to focus an incident light to the first photodiode and the second photodiode.

19 Claims, 41 Drawing Sheets

DEPTH PIXEL HAVING MULTIPLE PHOTODIODES AND TIME-OF-FLIGHT SENSOR INCLUDING THE SAME

CROSS-REFERENCE TO RELATED APPLICATION

Korean Patent Application No. 10-2020-0161448, filed on Nov. 26, 2020, in the Korean Intellectual Property Office, and entitled: "Depth Pixel Having Multiple Photodiodes and Time of Flight Sensor Including the Same," is incorporated by reference herein in its entirety.

BACKGROUND

1. Field

Example embodiments relate generally to semiconductor integrated circuits, and more particularly to a depth pixel including a plurality of photodiodes and a time-of-flight sensor including the depth pixel.

2. Description of the Related Art

Recently, interest in sensing technologies for acquiring three-dimensional information of an object is increasing and various three-dimensional cameras have been developed.

SUMMARY

Embodiments are directed to a depth pixel of a time-of-flight (ToF) sensor formed in a semiconductor substrate, the depth pixel including: a first photodiode; a first tap disposed at a first side of the first photodiode in a first horizontal direction to sample a photo charge stored in the first photodiode; a second tap disposed at a second side of the first photodiode in the first horizontal direction to sample the photo charge stored in the first photodiode; a second photodiode disposed at a side of the first photodiode in a second horizontal direction perpendicular to the first horizontal direction; a third tap disposed at a first side of the second photodiode in the first horizontal direction to sample a photo charge stored in the second photodiode; a fourth tap disposed at a second side of the second photodiode in the first horizontal direction to sample the photo charge stored in the second photodiode; and a common microlens disposed above or below the semiconductor substrate, the common microlens covering both of the first photodiode and the second photodiode to focus an incident light to the first photodiode and the second photodiode.

Embodiments are also directed to a time-of-flight (ToF) sensor, including: a sensing unit including a depth pixel configured to provide information on a distance to an object based on an incident light that is reflected from the object; and a controller configured to control the sensing unit. The depth pixel may include: a first sub depth pixel including a first photodiode and first and second taps to sample a photo charge stored in the first photodiode; a second sub depth pixel including a second photodiode and third and fourth taps to sample a photo charge stored in the second photodiode; and a common microlens disposed above or below a semiconductor substrate that includes the first photodiode and the second photodiode, the common microlens covering both of the first photodiode and the second photodiode to focus the incident light to the first photodiode and the second photodiode.

Embodiments are also directed to a depth pixel of a time-of-flight (ToF) sensor formed in a semiconductor substrate, the depth pixel including: a first sub depth pixel including a first photodiode and first and second taps to sample a photo charge stored in the first photodiode; a second sub depth pixel including a second photodiode and third and fourth taps to sample a photo charge stored in the second photodiode; and a common microlens disposed above or below the semiconductor substrate, the common microlens covering both of the first photodiode and the second photodiode to focus an incident light to the first photodiode and the second photodiode.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, structures according to example embodiments are described using a first horizontal direction X, a second horizontal direction Y, and a vertical direction Z in a three-dimensional space. The first horizontal direction X and the second horizontal direction Y may be substantially parallel with an upper surface of a semiconductor substrate, and substantially perpendicular to each other. The vertical direction Z may be substantially perpendicular to the upper surface of the semiconductor substrate. The first direction X may be a row direction and the second direction Y may be a column direction, or vice versa.

Figure 1:
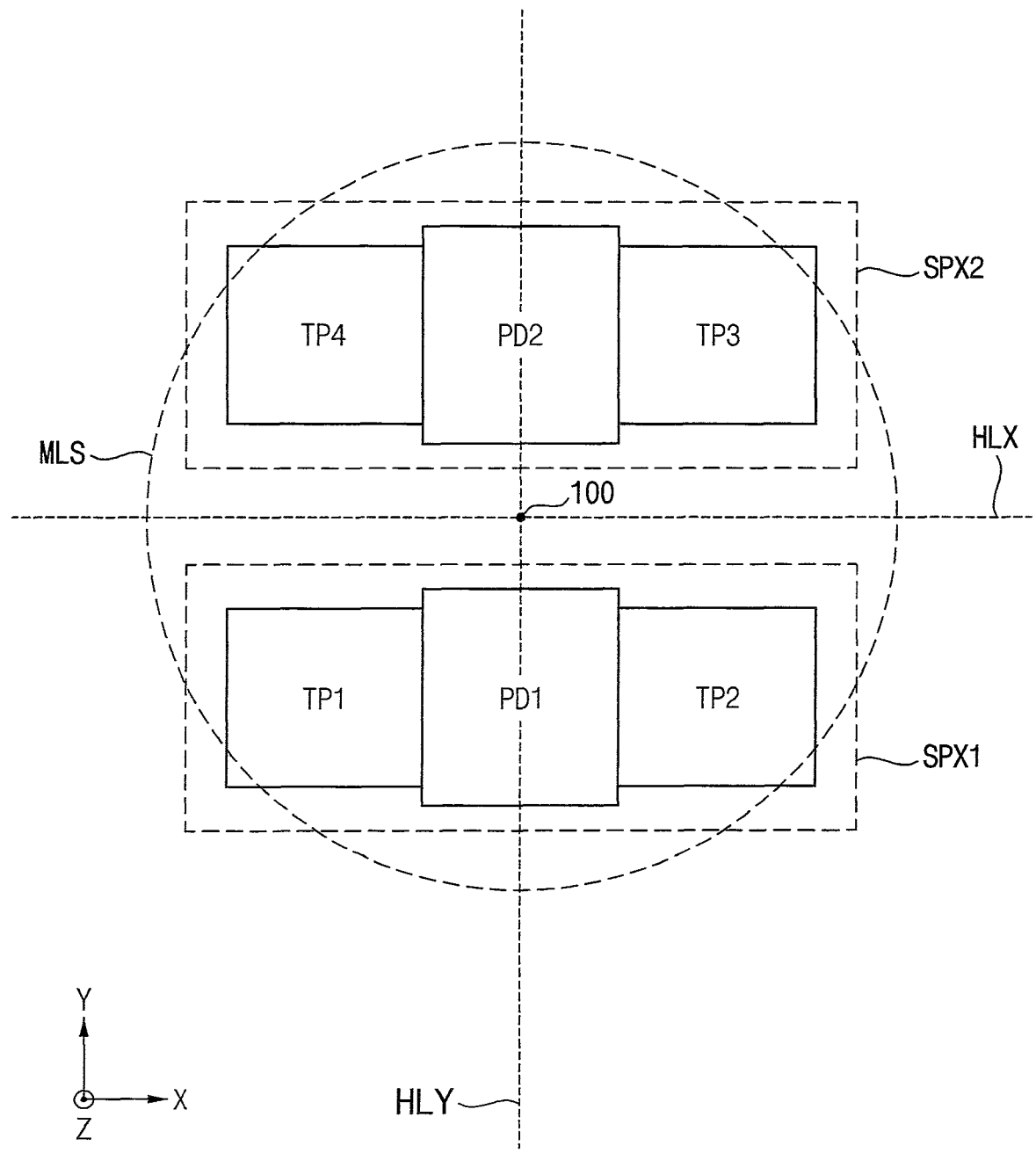
FIG. 1 is a diagram illustrating a layout of a depth pixel according to example embodiments.

FIG. 1 is a diagram illustrating a layout of a depth pixel according to example embodiments.

Referring to FIG. 1, a depth pixel PX may include a first photodiode PDD1, a first tap TP1, a second tap TP2, a second photodiode PD2, and a common microlens MLS. The depth pixel PX may be used in, e.g., a time-of-flight (ToF) sensor.

Referring to FIG. 1, the first tap TP1 may be disposed at a first side of the first photodiode PD1 in the first horizontal direction X. The first tap TP1 may be used to sample a photo charge stored in the first photodiode PD1. The second tap TP2 may be disposed at a second side of the first photodiode PD1 in the first horizontal direction X. The second tap TP2 may be used to sample the photo charge stored in the first photodiode PD1.

The second photodiode PD2 may be disposed at a side of the first photodiode PD1 in the second horizontal direction Y. The third tap TP3 may be disposed at a first side of the second photodiode PD2 in the first horizontal direction X. The third tap TP3 may be used to sample a photo charge stored in the second photodiode PD2. The fourth tap TP4 may be disposed at a second side of the second photodiode PD2 in the first horizontal direction X. The fourth tap TP4 may be used to sample the photo charge stored in the second photodiode PD2.

The common microlens MLS may be disposed above or below a semiconductor substrate, e.g., a semiconductor substrate that includes the first and second photodiodes PD1, PD2. The common microlens MLS may cover both of the first photodiode PD1 and the second photodiode PD2, and may be configured to focus an incident light to the first photodiode PD1 and the second photodiode PD2.

The first photodiode PD1, the first tap TP1, and the second tap TP2 may correspond to a first sub depth pixel SPX1 having a two-tap structure. The second photodiode PD2, the third tap TP3, and the fourth tap TP4 correspond to a second sub depth pixel SPX2 having the two-tap structure.

Referring to FIG. 1, the first sub depth pixel SPX1 and the second sub depth pixel SPX2 may be symmetric with respect to a first horizontal line HLX passing through a center CP of the depth pixel PX and extending in the first horizontal direction X. Each of the first sub depth pixel SPX1 and the second sub depth pixel SPX2 may be symmetric with respect to a second horizontal line HLY passing through the center CP of the depth pixel PX and perpendicular to the first horizontal line HLX.

The depth pixel and the ToF sensor may be used to perform functions such as an auto focusing function, in addition to a function of the ToF sensor to measure a distance, using the depth pixel including the plurality of photodiodes.

Hereinafter, a ToF sensor according to example embodiments and operations of the ToF sensor are described with reference to FIGS. 2, 3, and 4.

Figure 2:
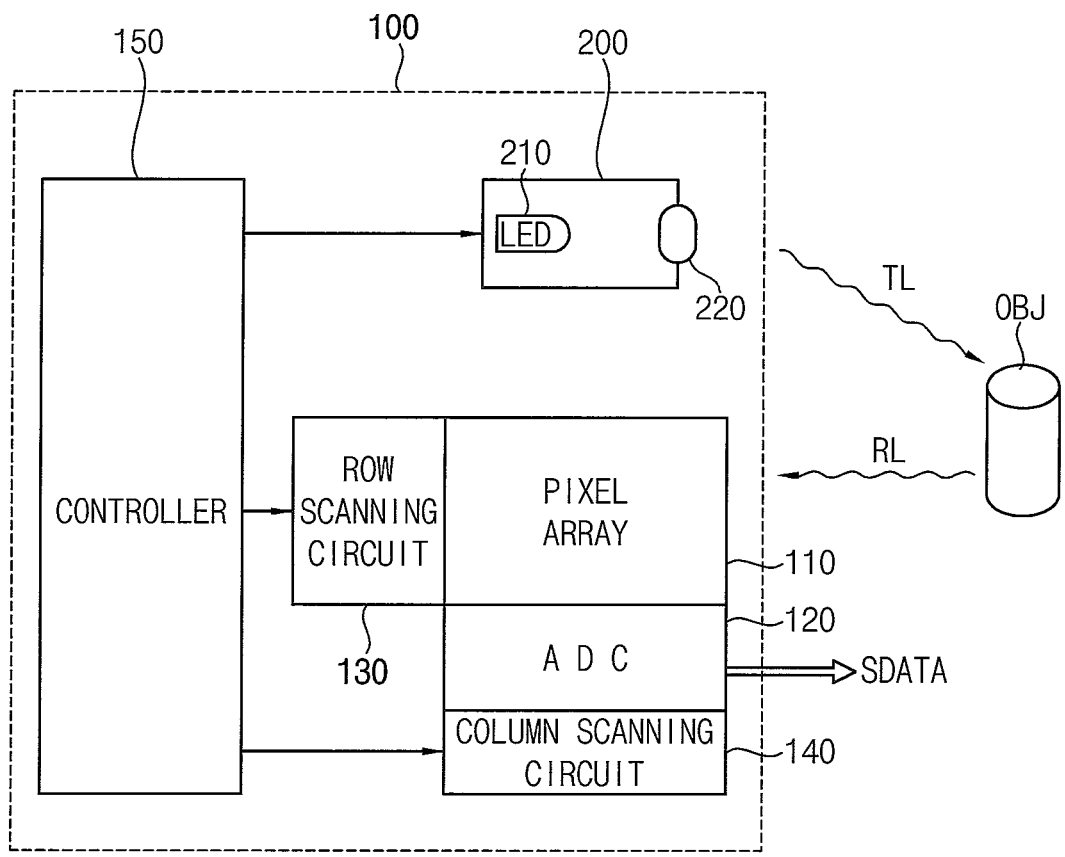
FIG. 2 is a block diagram illustrating a time-of-flight (ToF) sensor according to example embodiments.

FIG. 2 is a block diagram illustrating a time-of-flight (ToF) sensor according to example embodiments. FIGS. 3 and 4 are diagrams for describing an example method of measuring and calculating a distance to an object.

Referring to FIG. 2, a ToF sensor 100 may include a sensing unit (e.g., a sensor), a controller 150, and a light source module 200. The sensing unit may include a pixel array 110, an analog-to-digital converter (ADC) unit 120 (or ADC), a row scanning circuit 130, and a column scanning circuit 140.

The pixel array 110 may include depth pixels that receive light RL, e.g., reflected light that is reflected from an object OBJ after being transmitted to the object OBJ by the light source module 200. The depth pixels may convert the received light RL into electrical signals. The depth pixels may provide information about a distance of the object OBJ from the ToF sensor 100 and/or may provide image information, e.g., black-and-white image information.

In some example embodiments, the pixel array 110 may include color pixels for providing color image information. In this case, the ToF sensor 100 may be a three-dimensional color image sensor that provides the color image information and the depth information. In some example embodiments, an infrared filter and/or a near-infrared filter may be arranged on the depth pixels, and a color filter (e.g., red, green, and blue filters) may be formed on the color pixels. In some example embodiments, a ratio of the number of the depth pixels to the number of the color pixels may vary as desired or by design.

The ADC unit 120 may convert an analog signal output from the pixel array 110 into a digital signal. In some example embodiments, the ADC unit 120 may perform a column analog-to-digital conversion that converts analog signals in parallel using a plurality of analog-to-digital converters respectively coupled to a plurality of column lines. In some example embodiments, the ADC unit 120 may perform a single analog-to-digital conversion that sequentially converts the analog signals using a single analog-to-digital converter.

In some example embodiments, the ADC unit 120 may include a correlated double sampling (CDS) unit for extracting an effective signal component. The CDS unit may perform an analog double sampling that extracts the effective signal component based on a difference between an analog reset signal including a reset component and an analog data signal including a signal component. The CDS unit may perform a digital double sampling that converts the analog reset signal and the analog data signal into two digital signals, and extracts the effective signal component based on a difference between the two digital signals. Additionally, the CDS unit may perform a dual correlated double sampling that performs both the analog double sampling and the digital double sampling.

The row scanning circuit 130 may receive control signals from the controller 150, and may control a row address and a row scan of the pixel array 110. To select a row line among a plurality of row lines, the row scanning circuit 130 may apply a signal for activating the selected row line to the pixel array 110. In some example embodiments, the row scanning circuit 130 may include a row decoder, which selects a row line of the pixel array 110, and a row driver, which applies a signal for activating the selected row line.

The column scanning circuit 140 may receive control signals from the controller 150, and may control a column address and a column scan of the pixel array 110. The column scanning circuit 140 may output a digital output signal from the ADC unit 120 to a digital signal processing circuit (not shown) and/or to an external host (not shown). The column scanning circuit 140 may provide the ADC unit 120 with a horizontal scan control signal to sequentially select a plurality of analog-to-digital converters included in the ADC unit 120.

The controller 150 may control the ADC unit 120, the row scanning circuit 130, the column scanning circuit 140, and the light source module 200. The controller 150 may provide the ADC unit 120, the row scanning circuit 130, the column scanning circuit 140, and the light source module 200 with control signals, such as at least one of a clock signal, a timing control signal, or the like. The controller 150 may include at least one of a control logic circuit, a phase locked loop circuit, a timing control circuit, a communication interface circuit, or the like.

The light source module 200 may emit light (transmission light TL) of a desired or predetermined wavelength. For example, the light source module 200 may emit infrared light and/or near-infrared light. The light source module 200 may include a light source 210 and a lens 220. The light source 210 may be controlled by the controller 150 to emit the transmission light TL of a desired intensity and/or characteristic (for example, periodic). For example, the intensity and/or characteristic of the transmission light TL may be controlled such that the transmission light TL has a waveform of a pulse wave, a sine wave, a cosine wave, or the like. The light source 210 may be implemented by a light emitting diode (LED), a laser diode, or the like.

A first operation (e.g., normal operation) of the ToF sensor 100 according to example embodiments will now be described.

The controller 150 may control the light source module 200 to emit the transmission light TL having the periodic intensity. The transmission light TL emitted by the light source module 200 may be reflected from the object OBJ back to the ToF sensor 100 as the reception light RL. The reception light RL may be incident on the depth pixels, and the depth pixels may be activated by the row scanning circuit 130 to output analog signals corresponding to the reception light RL. The ADC unit 120 may convert the analog signals output from the depth pixels into sample data SDATA. The sample data SDATA may be provided by the column scanning circuit 140 and/or the ADC unit 120 to the controller 150, a digital signal processing circuit, and/or an external host.

The controller 150 may calculate a distance of the object OBJ from the ToF sensor 100, a horizontal position of the object OBJ, a vertical position of the object OBJ, and/or a size of the object OBJ based on the sample data SDATA. The controller 150 may control an emission angle or a projection (or incident) region of the transmission light TL based on the distance, the horizontal position, the vertical position, and/or the size of the object OBJ. For example, the controller 150 may control an interval between the light source 210 and the lens 220, a relative position (or a placement) of the light source 210 and the lens 220 with respect to each other, a refractive index of the lens 220, a curvature of the lens 220, or the like.

The transmission light TL illuminated to the object OBJ may be reflected from the object OBJ, and the reflection light RL may be incident on the depth pixels in the pixel array 110. The depth pixels may output analog signals corresponding to the reflection light RL. The ADC unit 120 may convert the analog signals to digital data or the sample data SDATA. The sample data SDATA and/or the depth information may be provided to the controller 150, the digital signal processing circuit, and/or the external host. In some example embodiments, the pixel array 110 may include color pixels, and color image information as well as the depth information may be provided to the digital signal processing circuit and/or the external host.

Figure 3:
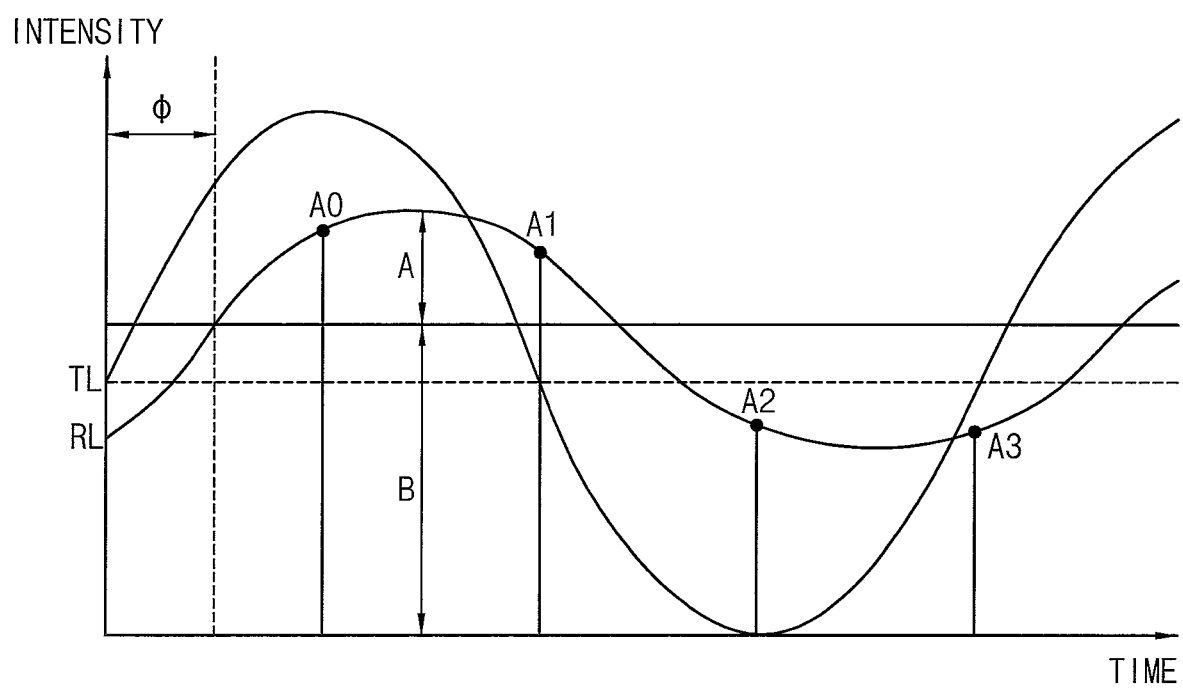
FIGS. 3 and 4 are diagrams for describing an example method of measuring and calculating a distance to an object.

Referring to FIGS. 2 and 3, the transmission light TL emitted by a light source module 200 may have a periodic intensity and/or characteristic. For example, the intensity (i.e., the number of photons per unit area) of the transmission light TL over time may have a waveform of a sine wave.

The transmission light TL emitted by the light source module 200 may be reflected from the object OBJ, and then may be incident on the pixel array 110 as the reception light RL. The pixel array 110 may periodically sample the reception light RL. In some example embodiments, during each period of the reception light RL (for example, corresponding to a period of the transmitted light TL), the pixel array 110 may perform a sampling on the reception light RL by sampling, e.g., at two sampling points having a phase difference of about 180 degrees, at four sampling points having a phase difference of about 90 degrees, or at more than four sampling points. For example, the pixel array 110 may extract four samples A0, A1, A2, and A3 of the reception light RL at phases of 90 degrees (or about 90 degrees), 180 degrees (or about 180 degrees), 270 degrees (or about 270 degrees), and 360 degrees (or about 360 degrees) per period, respectively.

The reception light RL may have an offset B that is different from an offset of the transmission light TL emitted by the light source module 200 due to background light, noise, or the like. The offset B of the reception light RL may be calculated by Equation 1.

$$B = \frac{A0 + A1 + A2 + A3}{4} \quad \text{[Equation 1]}$$

Here, A0 represents an intensity of the reception light RL sampled at a phase of about 90 degrees of the emitted light TL, A1 represents an intensity of the reception light RL sampled at a phase of about 180 degrees of the emitted light TL, A2 represents an intensity of the reception light RL sampled at a phase of about 270 degrees of the emitted light TL, and A3 represents an intensity of the reception light RL sampled at a phase of about 360 degrees of the emitted light TL.

The reception light RL may have an amplitude A lower than that of the transmission light TL emitted by the light source module 200 due to loss (for example, light loss). The amplitude A of the reception light RL may be calculated by Equation 2.

$$A = \frac{\sqrt{(A0-A2)^2 + (A1-A3)^2}}{2} \quad \text{[Equation 2]}$$

Black-and-white image information about the object OBJ may be provided by respective depth pixels included in the pixel array 110 based on the amplitude A of the reception light RL.

The reception light RL may be delayed by a phase difference Φ corresponding, e.g., to twice the distance of the object OBJ from the ToF sensor 100 with respect to the emitted light TL. The phase difference Φ between the emitted light TL and the reception light RL may be calculated by Equation 3.

$$\phi = \arctan\left(\frac{A0-A2}{A1-A3}\right) \quad \text{[Equation 3]}$$

The phase difference Φ between the emitted light TL and the reception light RL may, e.g., correspond to a time-of-flight (TF). The distance of the object OBJ from the ToF sensor 100 may be calculated by an equation, "R=c*TF/2", where R represents the distance of the object OBJ, and c represents the speed of light. The distance of the object OBJ from the ToF sensor 100 may also be calculated by Equation 4 using the phase difference Φ between the emitted light TL and the reception light RL.

$$R = \frac{c}{4\pi f}\phi \quad \text{[Equation 4]}$$

Here, f represents a modulation frequency, which is a frequency of the intensity of the emitted light TL (or a frequency of the intensity of the reception light RL).

As described above, the ToF sensor 100 according to example embodiments may obtain depth information about the object OBJ using the transmission light TL emitted by the light source module 200. Although FIG. 3 illustrates the transmission light TL of which the intensity has a waveform of a sine wave, it is understood that embodiments are not limited thereto. For example, the ToF sensor 100 may use the transmission light TL of which the intensity has various types of waveforms, according to example embodiments. The ToF sensor 100 may extract the depth information according to the waveform of the intensity of the transmission light TL, a structure of a depth pixel, or the like.

Figure 4:
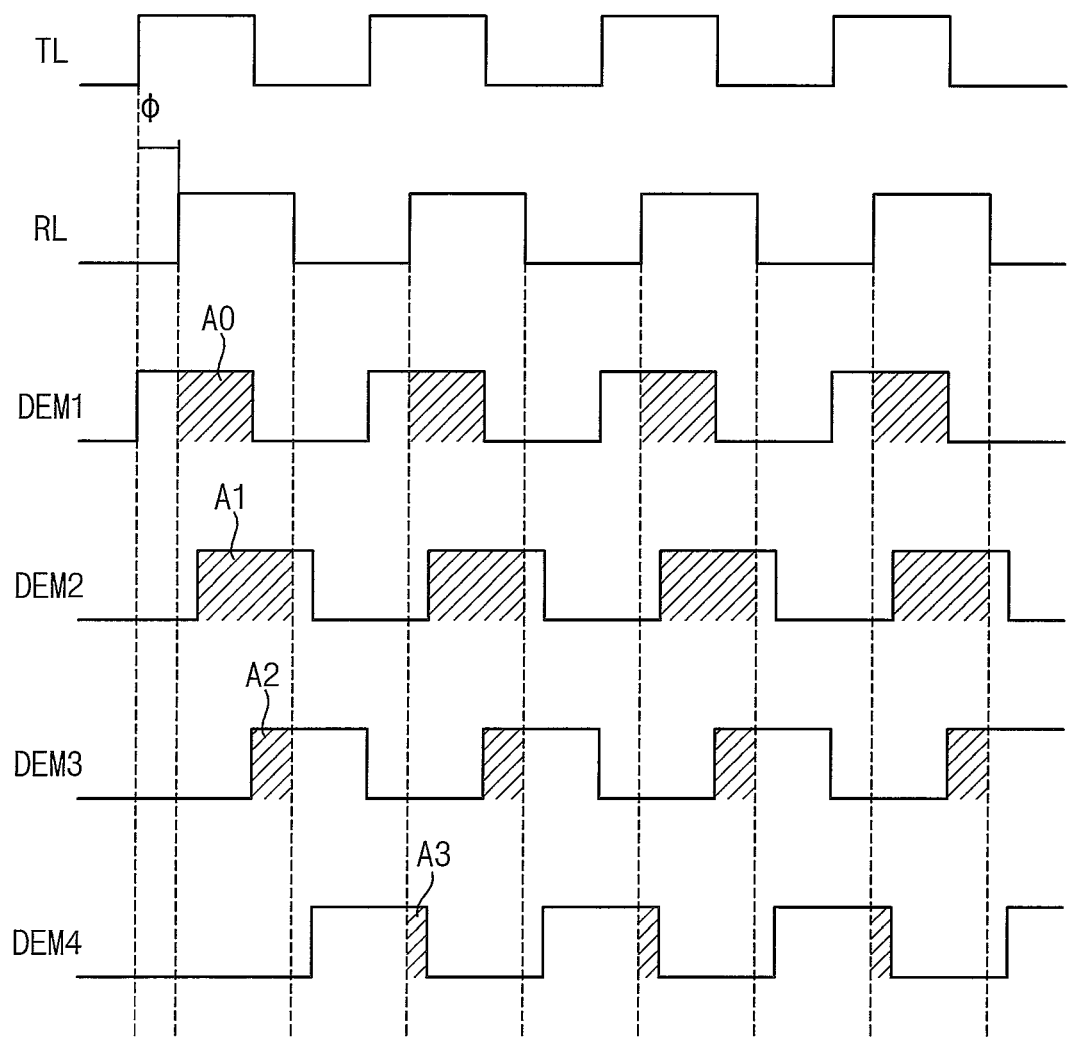

FIG. 4 illustrates an example of modulation timing and demodulation timings of a depth pixel having a four-tap structure, whereby the operation of the ToF sensor may be varied.

Referring to FIG. 4, the transmission light TL from the light source 210 may be output in synchronization with a signal provided from the controller 150. The first through fourth demodulation signals DEM1 through DEM4 may be generated in synchronization with the signal from the controller 150. The first through fourth demodulation signals DEM1 through DEM4 have phase differences of 0, 90, 180, and 270 degrees, respectively. As described above with reference to FIG. 3, four samples A0, A1, A2, and A3 of the reception light RL may be sampled at phases of about 90 degrees, about 180 degrees, about 270 degrees, and about 360 degrees per period, respectively.

Figure 5:
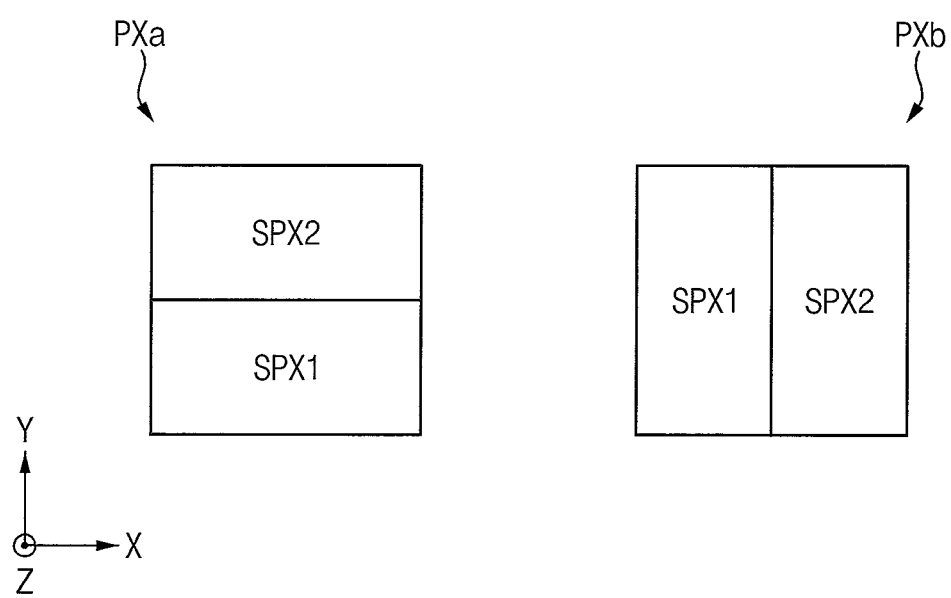
FIG. 5 is a diagram illustrating layouts of a depth pixel according to example embodiments.

FIG. 5 is a diagram illustrating layouts of a depth pixel according to example embodiments.

Referring to FIG. 5, each of depth pixels PXa and PXb may include a first sub depth pixel SPX1 and a second sub depth pixel SPX2 as described with reference to FIG. 1.

In some example embodiments, as the depth pixel PXa, the first sub depth pixel SPX1 and the second sub depth pixel SPX2 may be arranged in the second horizontal direction Y. In some example embodiments, as the depth pixel PXb, the first sub depth pixel SPX1 and the second sub depth pixel SPX2 may be arranged in the first horizontal direction X. As described below with reference to FIGS. 26 through 30, a pixel array of a ToF sensor may be implemented using various arrays of combination of the depth pixels PXa and PXb of FIG. 5.

Figure 6:
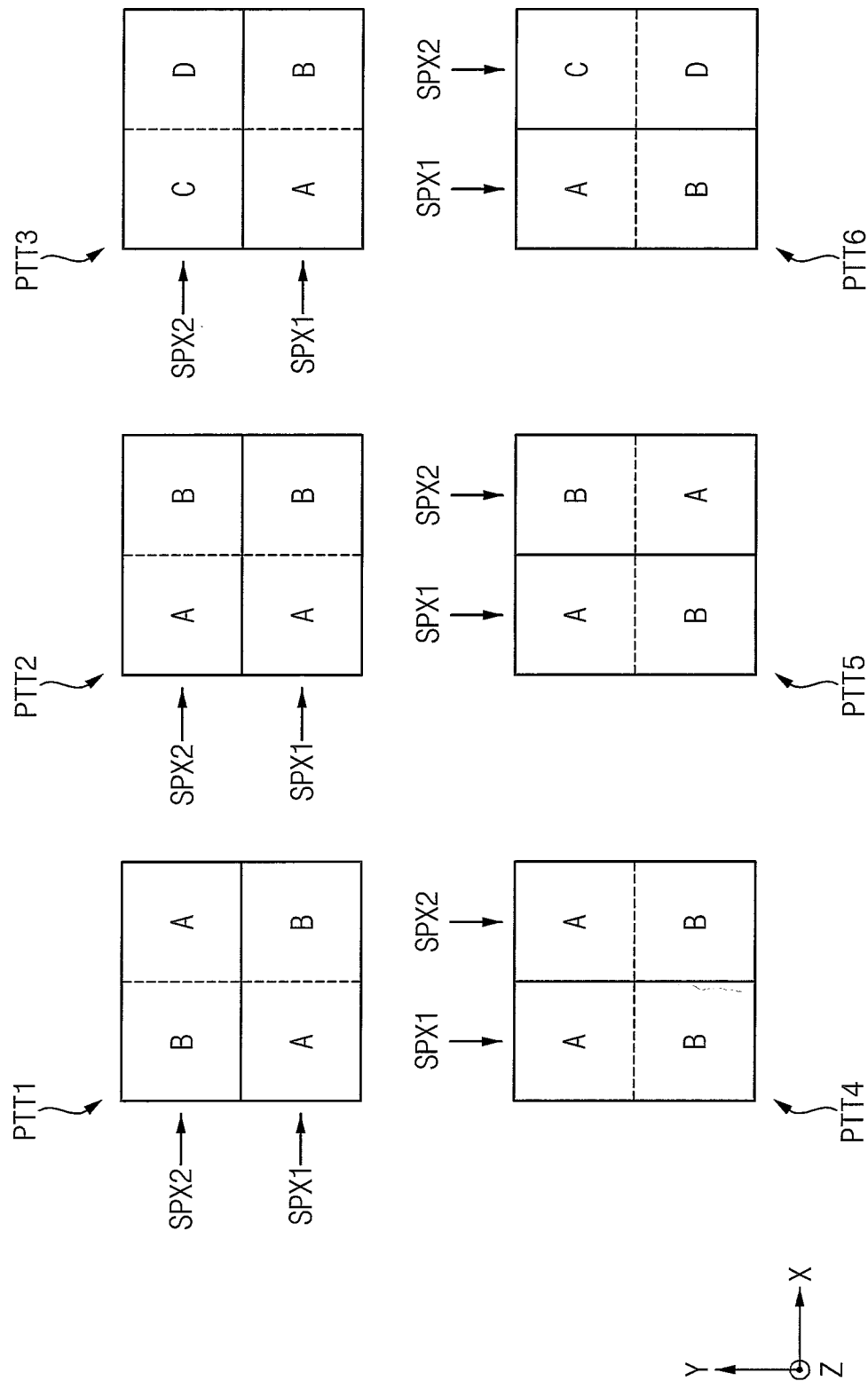
FIG. 6 is a diagram illustrating examples of applying demodulation signals in a depth pixel according to example embodiments.

FIG. 6 is a diagram illustrating example embodiments of applying demodulation signals in a depth pixel according to example embodiments.

In FIG. 6, the solid lines in each depth pixel indicate divisions of the sub depth pixels SPX1 and SPX2, and the dotted lines in each depth pixel indicate divisions of the taps in each of the sub depth pixels SPX1 and SPX2. FIG. 6 illustrates patterns PTT1~PTT6 of applying the demodulation signals as described with reference to FIGS. 2 through 4. In FIGS. 6, A, B, C, and D indicate different phases of demodulation signals respectively applied to the first through fourth taps. For example, the phased of the demodulation signals may be determined such as A=0°, B=180°, C=90°, and D=270° or such as A=90°, B=270°, C=0°, and D=180°.

Figure 7:
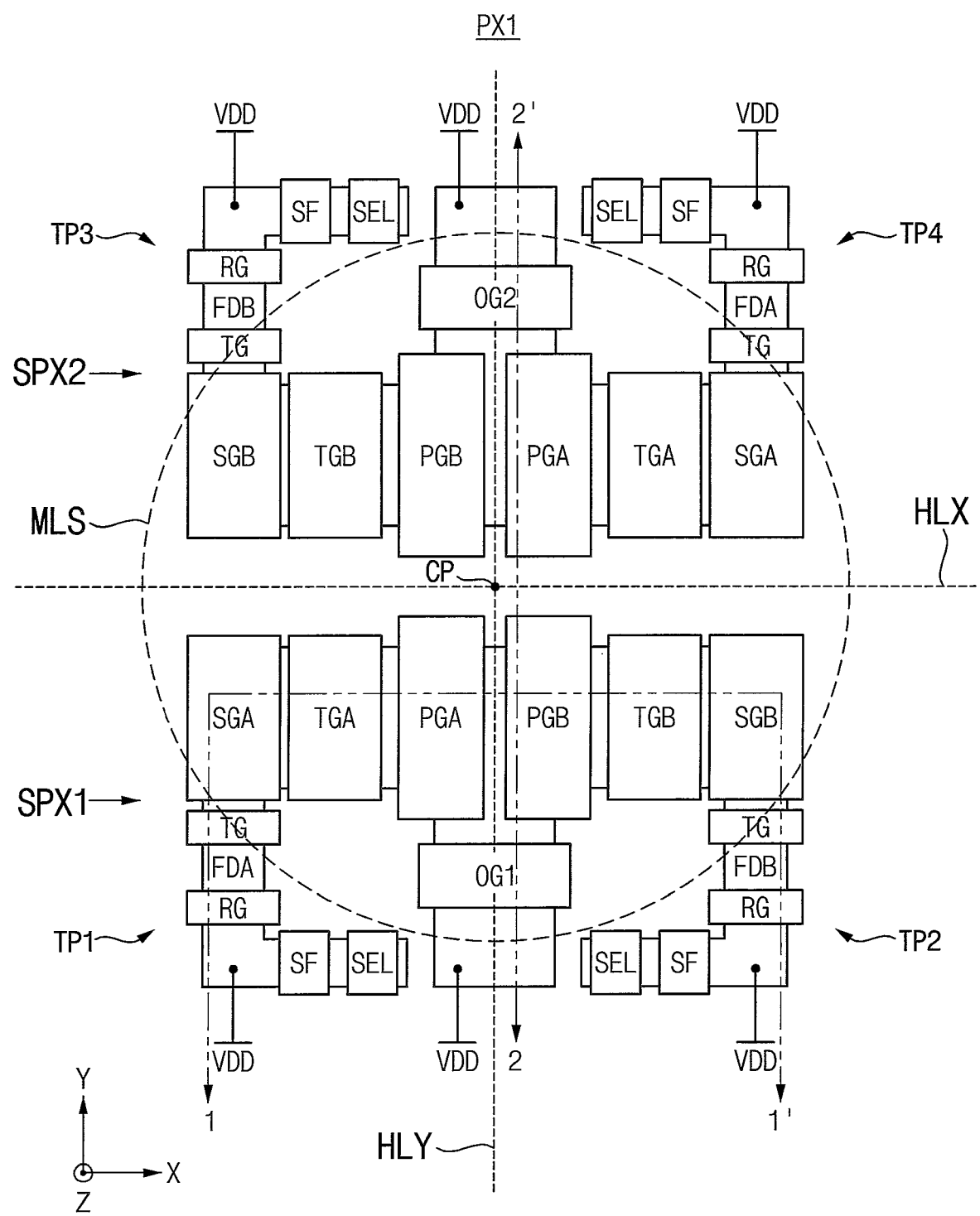
FIG. 7 is a diagram illustrating a layout of a depth pixel according to example embodiments.
Figure 8:
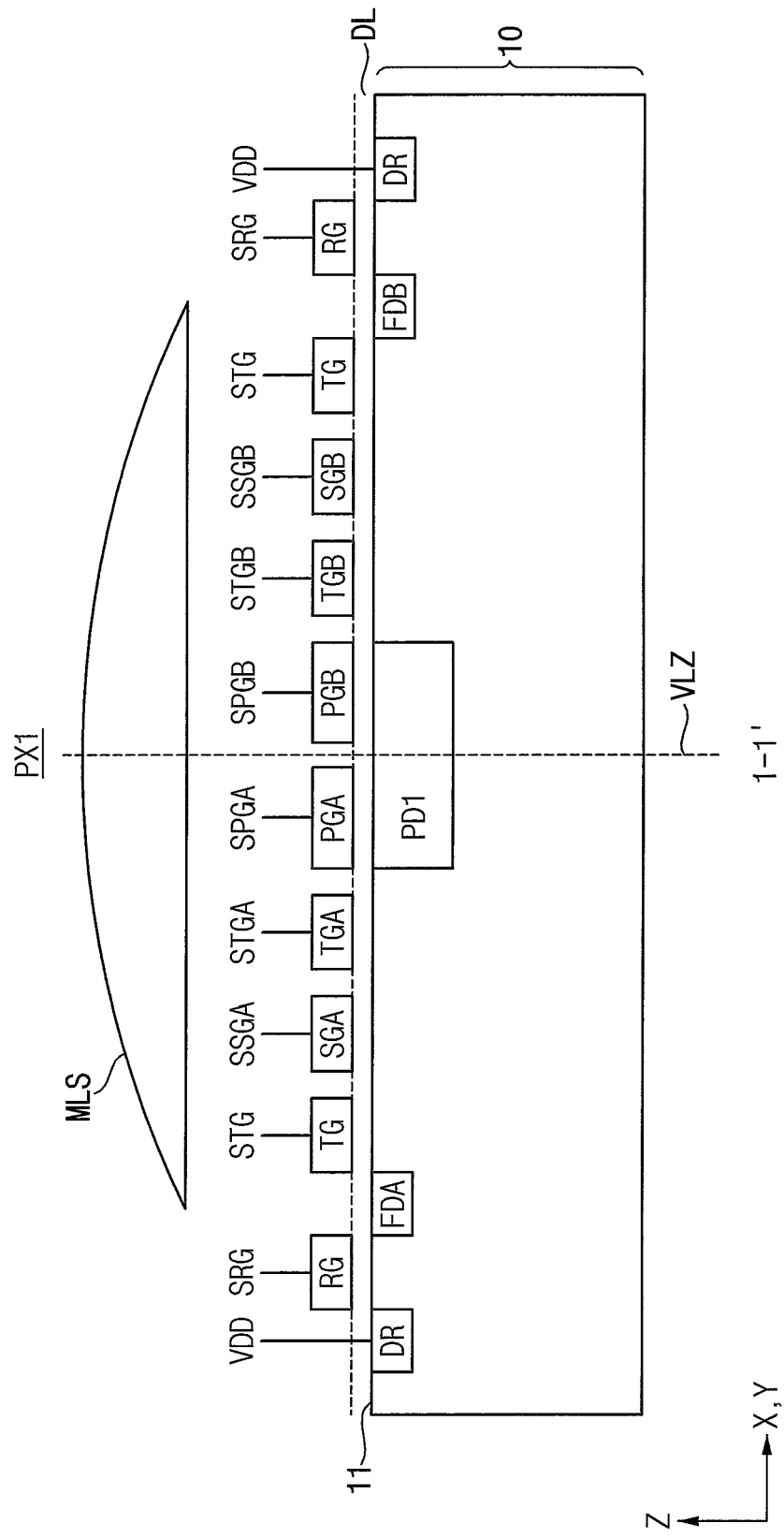
FIGS. 8 and 9 are cross-sectional views illustrating vertical structures of the depth pixel of FIG. 7.
Figure 9:
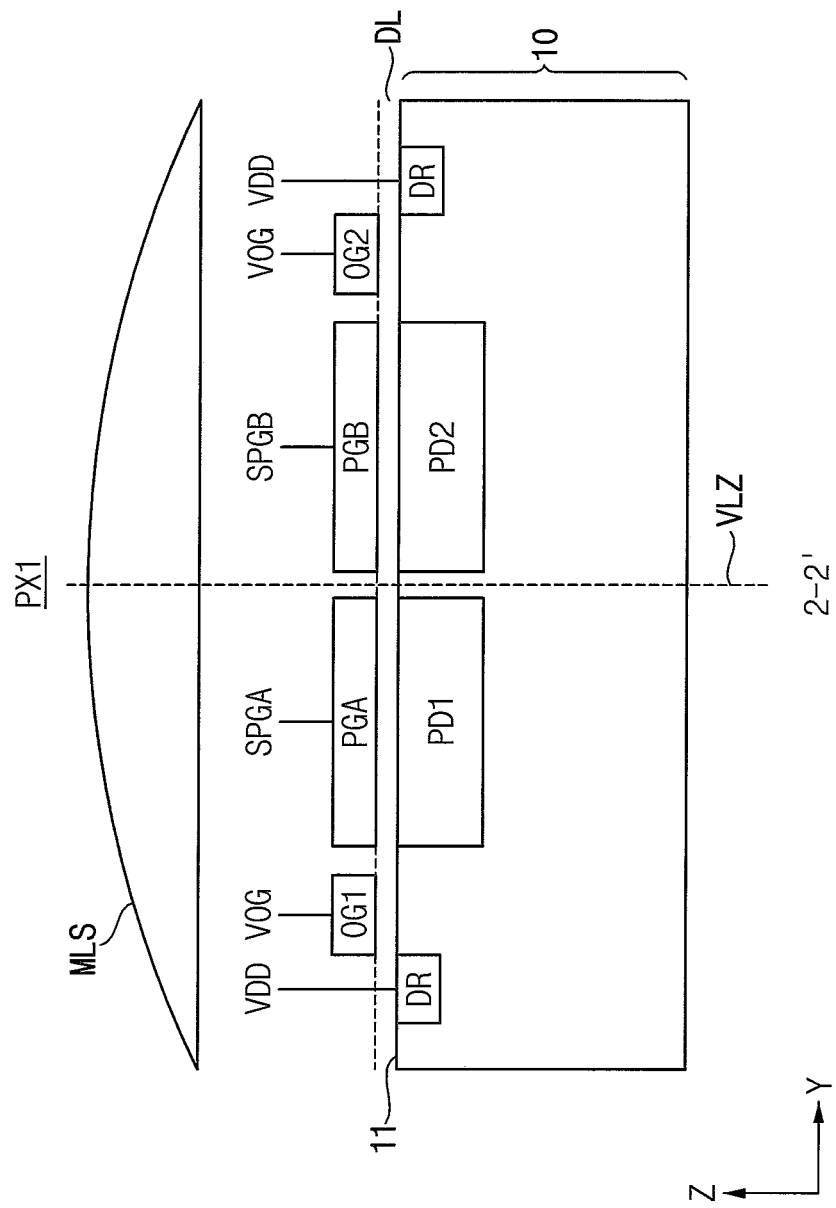

FIG. 7 is a diagram illustrating a layout of a depth pixel according to example embodiments, and FIGS. 8 and 9 are cross-sectional views illustrating vertical structures of the depth pixel of FIG. 7. The descriptions repeated with FIG. 1 may be omitted. FIG. 8 is a cross-sectional view of the depth pixel of FIG. 7 along a 1-1' line, and FIG. 9 is a cross-sectional view of the depth pixel of FIG. 7 along a 2-2' line.

Referring to FIGS. 7 through 9, a depth pixel PX1 may include a first sub depth pixel SPX1 and a second sub depth pixel SPX2. Each of the first sub depth pixel SPX1 and the second sub depth pixel SPX2 may have a two-tap structure. The first sub depth pixel SPX1 may include a first tap TP1 and a second TP2, and the second sub depth pixel SPX2 may include a third tap TP3 and a fourth tap TP4.

In some example embodiments, referring to FIGS. 8 and 9, the common microlens MLS may be disposed above a semiconductor substrate 10. In some example embodiments, the common microlens MLS may be disposed below a semiconductor substrate 10 as described below with reference to FIGS. 31 through 36.

The first through fourth taps TP1~TP4 may include photogates PGA and PGB, demodulation transfer gates TGA and TGB, and FD transfer gates TG that are formed above the semiconductor substrate 10, and photodiodes PD1 and PD2, floating diffusion regions FDA and FDB, and drain regions DR that formed in the semiconductor substrate 10. Other gates RG, SF, and SEL are gates of reset transistors TRG, source follower transistors TSF, and selection transistors TSL in FIG. 10 that correspond to readout circuits configured to read out the charges stored in the floating diffusion regions FDA and FDB.

Each of the photogates PGA and PGB may collect photo charge in each of the first photodiode PD1 and the second photodiode PD2 in response to each demodulation signal.

Each of the demodulation transfer gates TGA and TGB may transfer the photo charge collected by each of the photogates PGA and PGB. Each of the floating diffusion regions FDA and FDB may store the photo charge transferred through each of the demodulation transfer gates TGA and TGB.

In some example embodiments, each of the first through fourth taps TP1~TP4 may include a charge storing structure disposed between each of the demodulation transfer gates TGA and TGB and each of the floating diffusion regions FDA and FDB. The charge storing structures may temporarily store the photo charge transferred from the demodulation transfer gates TGA and TGB before transferring the photo charge to the floating diffusion regions FDA and FDB. In some example embodiments, the charge storing structures may be implemented with storage gates SGA and SGB. In some example embodiments, the charge storing structure may be implemented with the storage gates SGA and SGB and storage diodes formed in the semiconductor substrate 10 under the storage gates SGA and SGB. Such charge storing structures may be used for correlated double sampling (CDS) and may reduce read noise. In some example embodiments, the FD transfer gates TGA and TGB and/or the storage gates SGA and SGB may be omitted.

In some example embodiments, the first sub depth pixel SPX1 and the second sub depth pixel SPX2 may include overflow gates OG1 and OG2. As described below with reference to FIGS. 10 and 11, a plurality of demodulation signals having different phases may be applied to the photogates PGA and PGB during an integration period. An overflow gate voltage VOG applied to the overflow gates OG1 and OG2 may have a turn-off voltage level that causes draining of the photo charge to be blocked during the integration period.

Referring to FIGS. 8 and 9, the floating diffusion regions FDA and FDB and drain regions DR may be formed using, e.g., an ion implantation process or the like. The photogates PGA and PGB, the demodulation transfer gates TGA and TGB, the storage gates SGA and SGB, the reset gates RG, the FD transfer gates TG, and the overflow gates OG1 and OG2 may be spaced apart from an upper surface 11 of the semiconductor substrate 10 using, e.g., a deposition process, an etch process, etc. An insulation layer DL such as, e.g., an oxide layer, may be formed between the upper surface 11 of the semiconductor substrate 10 and the gates.

The gates may include, e.g., polysilicon, a transparent conducting oxide (TCO) such as, e.g., indium tin oxide (ITO), indium zinc oxide (IZO), zinc oxide (ZnO), titanium dioxide ($TiO_2$), etc.

In some example embodiments, the light may be incident on the depth pixel PX1 through the upper surface 11 of the semiconductor substrate 10. In this case, the common microlens MLS may be disposed above the semiconductor substrate 10 and the gates may include, e.g., a transparent conducting oxide. In some example embodiments, the light may be incident on the depth pixel PX1 through a lower surface of the semiconductor substrate 10. In this case, referring to FIGS. 31 through 36, the common microlens MLS may be disposed below the semiconductor substrate 10, and the gates may include, e.g., a non-transparent conducting oxide.

The depth pixel PX may include a photo charge storing region such as photodiodes PD1 and PD2 formed under the photogates PGA and PGB in the semiconductor substrate 10. The photodiodes PD1 and PD2 may be spaced apart from the floating diffusion regions FDA and FDB and the drain regions DR. In some example embodiments, the semiconductor substrate 10 may be a P-type semiconductor substrate, and the photodiodes PD1 and PD2 may be doped with N-type impurities. In some example embodiments, the semiconductor substrate 10 may be an N-type semiconductor substrate or may include an N-type well, and the photodiodes PD1 and PD2 may be doped with P-type impurities.

Photogate signals SPGA and SPGB may be applied to the photogates PGA and PGB, demodulation transfer control signals STGA and STGB may be applied to the demodulation transfer gates TGA and TGB, storage gate signals SSGA and SSGB may be applied to the storage gates SGA and SGB, an FD transfer control signal STG may be applied to the FD transfer gates TG, and a reset signal SRG may be applied to the reset gates RG, respectively. An overflow gate voltage VOG may be applied to the overflow gates OG1 and OG2, and a power supply voltage VDD may be applied to the drain regions DR.

The overflow voltage VOG may have a turn-off voltage level that causes draining of the photo charge to be blocked during the integration period, and a turn-on voltage level to drain the photo charge collected by the common photogate during the other periods such as a reset period and a readout period. During the other periods except the integration period, channels may be formed by the turn-on voltage level in the semiconductor substrate 10 between the photodiodes PD1 and PD2 and the drain regions DR, and the collected photo charge by the photogates PGA and PGB may be drained to the terminal of the power supply voltage VDD. As such, a global shutter function may be implemented using the overflow gates OG1 and OG2.

In comparison with the vertical structure of FIGS. 8 and 9, the semiconductor substrate 10 may include a plurality of regions that are doped with impurities of different conductivity types and/or different concentrations. For example, in a case in which the semiconductor substrate 10 has P-type conductivity, the semiconductor substrate 10 may include, in order from the upper surface 11 of the semiconductor substrate 10, an N− region, a P− region, and a P+ region, with the N− region being doped with N-type impurities while the P− region and the P+ region are doped with P-type impurities, and the P− region being more lightly doped than the P+ region. In a case in which near-infrared (NIR) light having a wavelength ranging from about 700 nm to about 850 nm is used as a light source in a TOF sensor, a P-type semiconductor substrate may be used as the semiconductor substrate 10.

Photons incident on the depth pixel PX1 may enter the P− region, and may generate electron-hole pairs in the P− region. Thus, the P− region may correspond to a main photo charge generating region where photo charges may be mainly generated. Photo-electrons generated as minority carriers may move into a depletion region of an N-P junction at a boundary between the N− region and the P− region, and may then be diffused and collected by the photogates PGA and PGB. Since the P+ region, which is heavily doped compared to the P− region, is located below the P− region, the photo-electrons generated near a boundary between the P− region and the P+ region may tend to move into the N-P junction portion.

In some example embodiments, the N− region may be replaced with a P region. In the case of this P region being disposed above the P− region, the photo electrons may be blocked when the gates are in the turned-off state, and may be transferred when the gates are in the turned-on state.

As such, the semiconductor substrate 10 may include a plurality of photo charge generating regions that are doped with impurities of different conductivity types and/or different concentrations, which may increase sensitivity of the depth pixel PX1.

Figure 10:
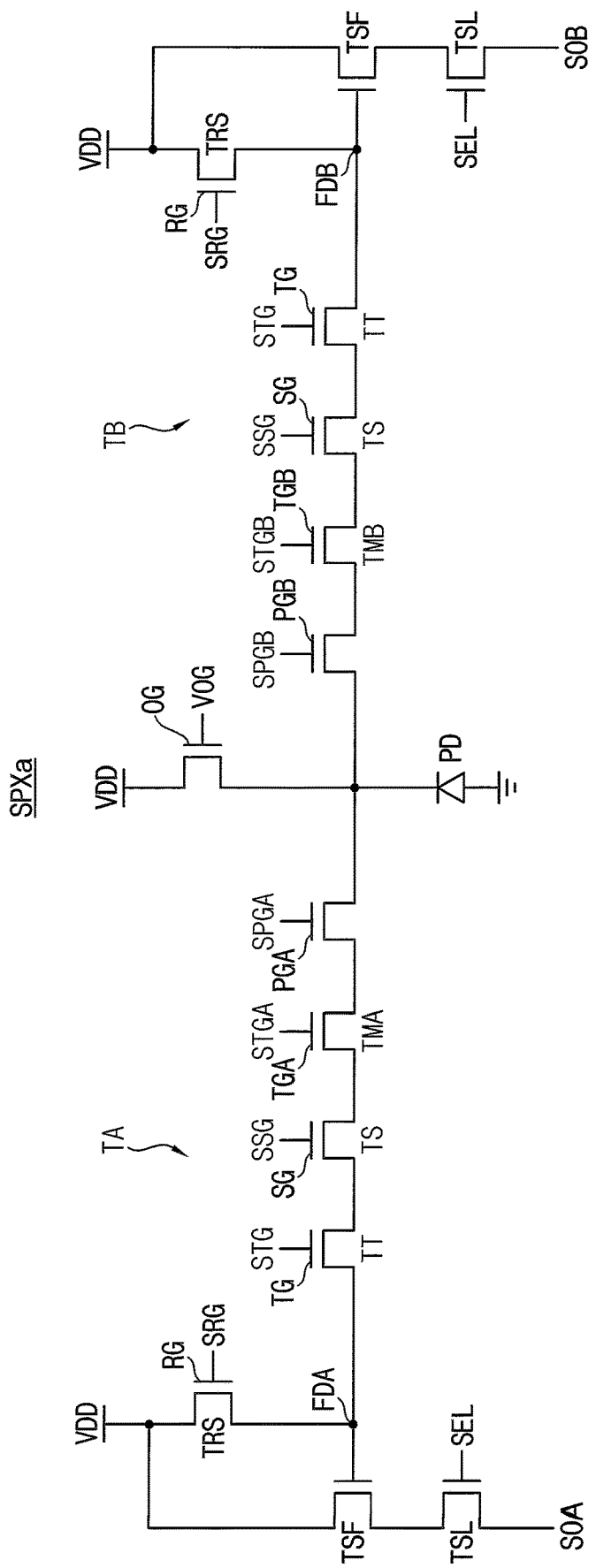
FIG. 10 is a circuit diagram illustrating a sub depth pixel having a two-tap structure in a ToF sensor according to example embodiments.
Figure 11:
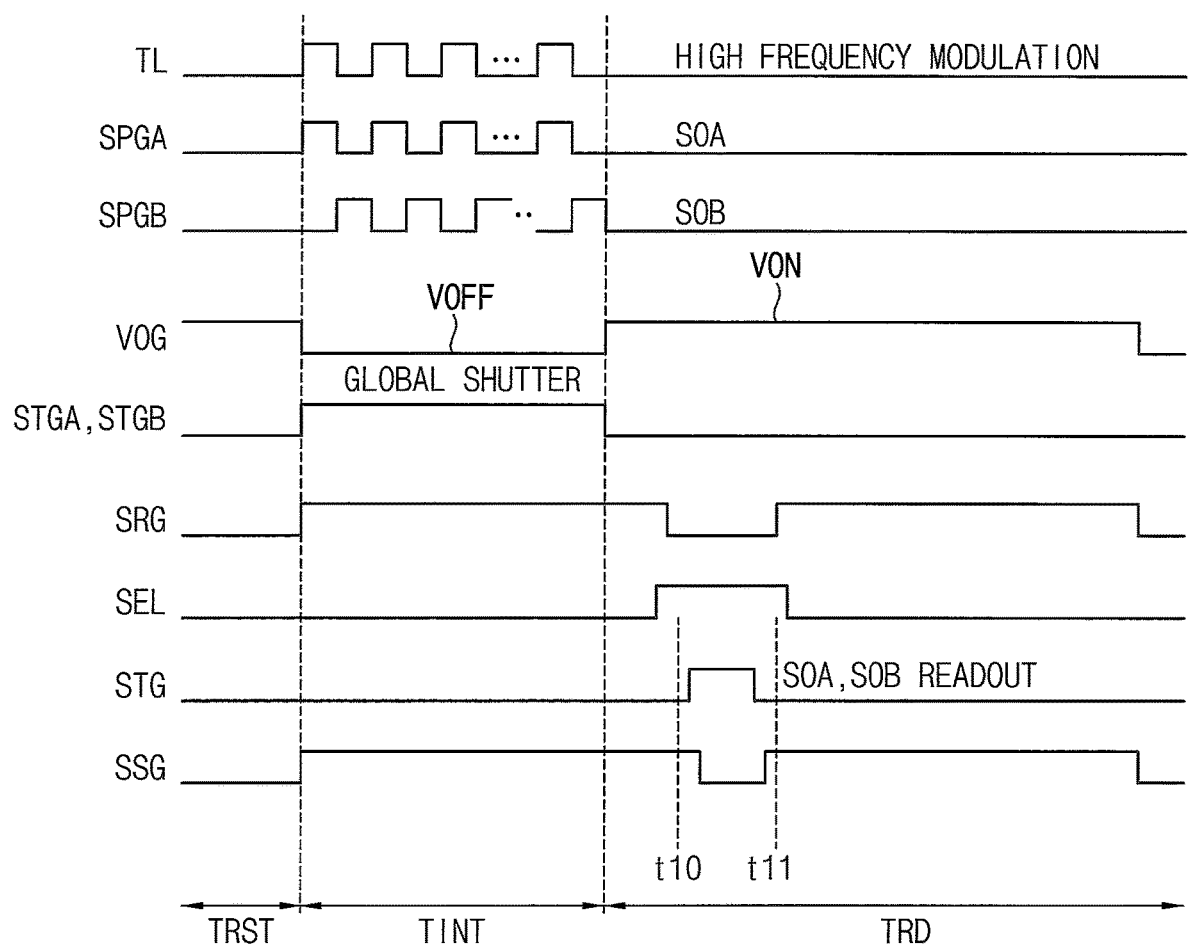
FIG. 11 is a timing diagram illustrating an example of an operation of a ToF sensor including the sub depth pixel of FIG. 10.

FIG. 10 is a circuit diagram illustrating a sub depth pixel having a two-tap structure in a ToF sensor according to example embodiments, and FIG. 11 is a timing diagram illustrating an example embodiment of an operation of a ToF sensor including the sub depth pixel of FIG. 10.

FIG. 10 illustrates a two-tap structure in which an individual photogate is applied per tap. Referring to FIG. 10, a sub depth pixel SPXa may include a first photogate PGA and transistors TMA, TS, and TT corresponding to the first tap TA, and a second photogate PGB and transistors TMB, TS, and TT corresponding to the second tap TB. The sub depth pixel SPXa may include transistors TRS, TSF, and TSL (corresponding to readout circuits), an overflow gate OG, and a photodiode PD. Each of the transistors TMA, TMB, TS, TT, and TRS may include a gate disposed above a semiconductor substrate, and source and drain regions at respective sides of the gate in the semiconductor substrate. The gates of the transistors TMA, TMB, TS, TT, and TRS correspond to a first demodulation transfer gate TGA, a second demodulation transfer gate TGB, storage gates SG, and floating diffusion (FD) transfer gates TG, and reset gates RG, respectively.

A first photogate signal SPGA is applied to the first photogate PGA, a second photogate signal SPGB is applied to the second photogate PGB, a first demodulation control signal STGA is applied to the first demodulation transfer gate TGA, a second demodulation control signal STGB is applied to the second demodulation transfer gate TGB, an overflow gate voltage VOG is applied to the overflow gate OG, a storage control signal SSG is applied to the storage gates SG, an FD transfer control signal STG is applied to the FD transfer gates TG, a reset signal SRG is applied to the reset gates RG, and a selection signal SEL is applied to the gates of the selection transistors TSL. The first photogate signal SPGA and the second photogate signal SPGB correspond to the above-described demodulation signals having different phases.

The photogate signals SPGA and SPGB corresponding to the demodulation signals, the demodulation transfer control signals STGA and STGB, the overflow gate voltage VOG, the storage control signal SSG, the FD transfer control signal STG, the reset signal SRG, and the selection signal SEL may be provided from the row scanning circuit 130 under control of a controller 150, e.g., as described with reference to FIG. 2.

The storage gates SG are one of charge storing structures that temporarily store the photo charge transferred from the photodiode PD through the demodulation transfer gates TGA and TGB before transferring the photo charge to the floating diffusion regions FDA and FDB. The charge stored in the floating diffusion regions FDA and FDB may be provided as output signal, e.g., the sampled data SOA and SOB using the source follower transistors TSF and the selection transistors TSL.

Referring to FIGS. 2, 10, and 11, the light source 210 may generate the transmission light TL modulated by a modulation frequency during an integration period TINT to collect a photo charge generated by the reflection light RL. The row scanning circuit 130 may apply the first and second photogate signals (e.g., the first and second demodulation signals SPGA and SPGB having the different phases) to the first and second photogates PGA and PGB corresponding to the first and second taps TA and TB.

The overflow voltage VOG applied to the overflow gates OG may have a turn-off voltage level VOFF to block the photo charge from being drained from the photodiode PD during the integration period TINT. The demodulation transfer control signals STGA and STGB and the storage control signal SSG are activated during the integration period TINT. Accordingly, the photo charge collected by the first and second demodulation signals SPGA and SPGB may be stored in the semiconductor substrate under the storage gates SG, respectively.

During the other periods, e.g., a reset period TRST (to initialize the depth pixel PX) and a readout period TRD (to measure an amount of the photo charge collected during the integration period TINT), the overflow gate voltage VOG may have a turn-on voltage level VON to drain the photo charge from the photodiode PD. The collected photo charge may be drained to the terminal of the power supply voltage VDD during the periods TRST and TRD other than the integration period TINT. As such, a global shutter function may be implemented using the overflow gate OG.

At a first time point t10 during the readout period TRD when the reset signal SRG is deactivated and the selection signal SEL is activated, first and second reset state data of the first and second taps TA and TB may be output through the column lines, respectively. At a second time point t11 during the readout period TRD when the FD transfer control signal STG is activated and the storage control signal SSG is deactivated, the photo charge stored by the storage gates SG may be transferred to the floating diffusion regions FDA and FDB, and the first and second sampled data SOA and SOB of the first and second taps TA and TB may be output through the column lines, respectively.

Figure 12:
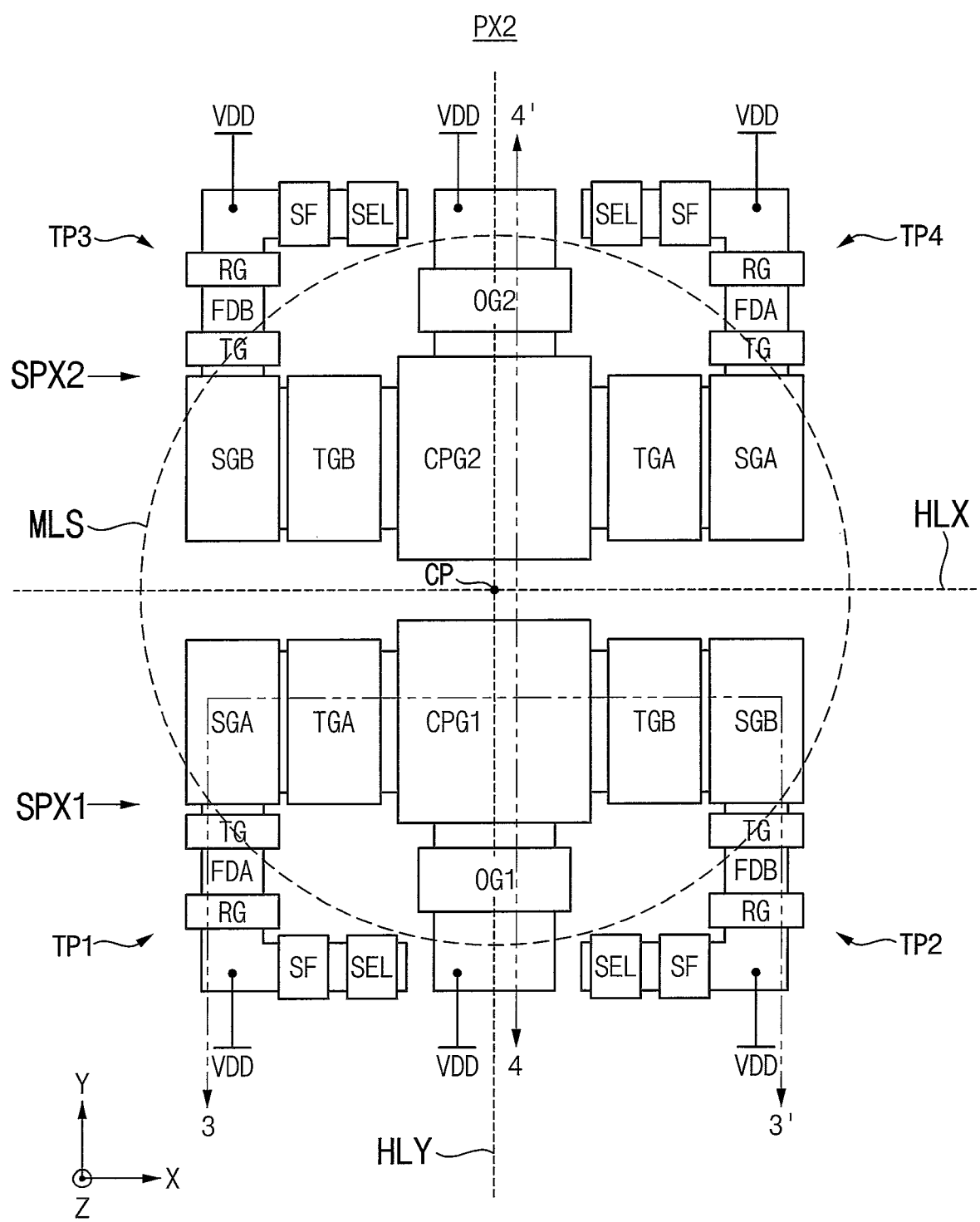
FIG. 12 is a diagram illustrating a layout of a depth pixel according to example embodiments.
Figure 13:
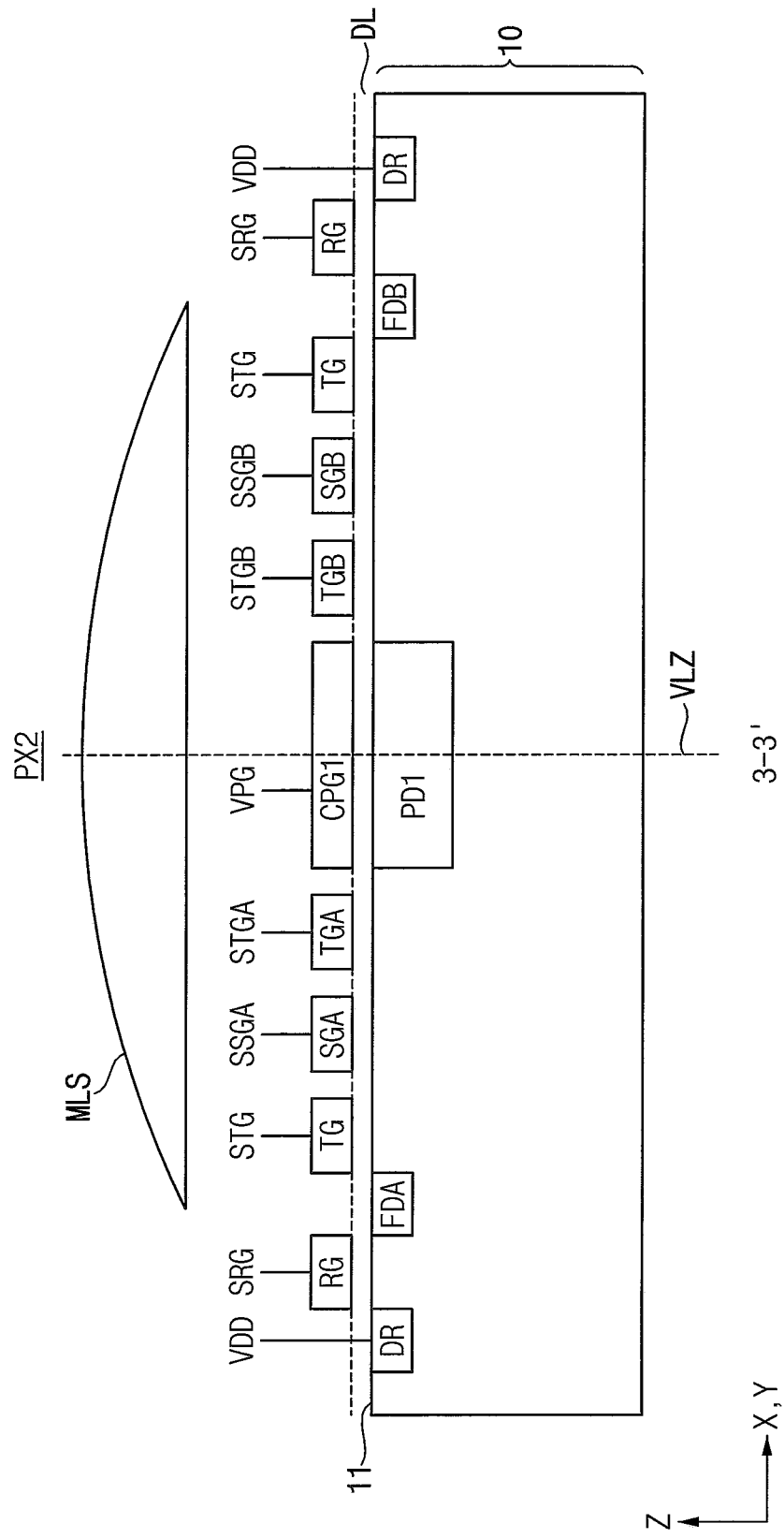
FIGS. 13 and 14 are cross-sectional views illustrating vertical structures of the depth pixel of FIG. 12.
Figure 14:
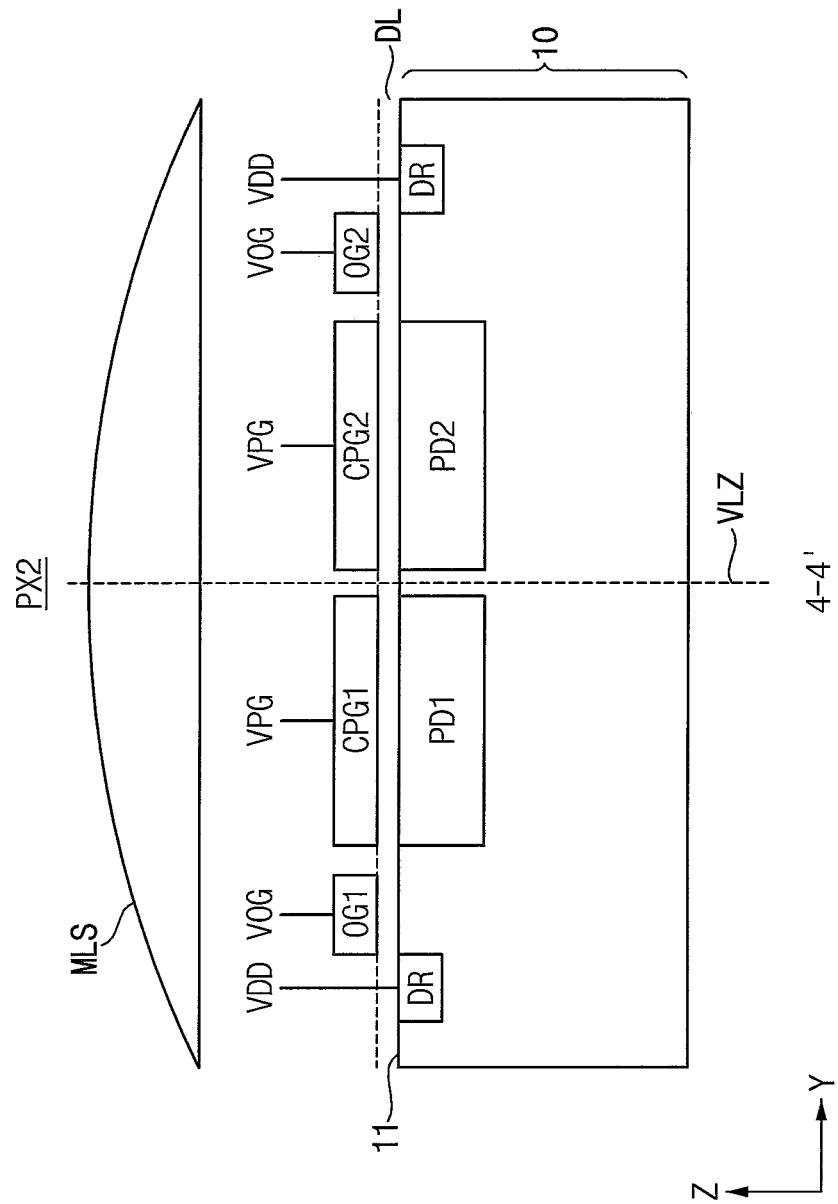

FIG. 12 is a diagram illustrating a layout of a depth pixel according to example embodiments, and FIGS. 13 and 14 are cross-sectional views illustrating vertical structures of the depth pixel of FIG. 12. FIG. 13 is a cross-sectional view of the depth pixel of FIG. 12 along a 3-3' line, and FIG. 14 is a cross-sectional view of the depth pixel of FIG. 12 along a 4-4' line. The descriptions repeated with FIGS. 7 through 9 may be omitted.

Referring to FIGS. 12 through 14, a depth pixel PX2 may include a first sub depth pixel SPX1 and a second sub depth pixel SPX2. Each of the first sub depth pixel SPX1 and the second sub depth pixel SPX2 may have a two-tap structure. The first sub depth pixel SPX1 may include a first tap TP1 and a second TP2, and the second sub depth pixel SPX2 may include a third tap TP3 and a fourth tap TP4.

The first through fourth taps TP1~TP4 may include common photogates CPG1 and CPG2, demodulation transfer gates TGA and TGB, and FD transfer gates TG that are formed above the semiconductor substrate 10, and photodiodes PD1 and PD2, floating diffusion regions FDA and FDB, and drain regions DR that formed in the semiconductor substrate 10.

A photogate voltage VPG may be applied to the common photogates CPG1 and CPG2, and demodulation transfer control signals STGA and STGB corresponding to the above-described demodulation signals may be applied to the demodulation transfer gates TGA and TGB. The first common photogate CPG1 may collect a photo charge in the first photodiode PD1, and the second common photogate CPG2 may collect a photo charge in the second photodiode PD2. Each of the demodulation transfer gates TGA and TGB may transfer the photo charge in each the photodiodes PD1 and PD2 in response to each of the demodulation signals TGA and TGB. Each of the floating diffusion regions FDA and FDB may store the photo charge transferred through each of the demodulation transfer gates TGA and TGB.

Figure 15:
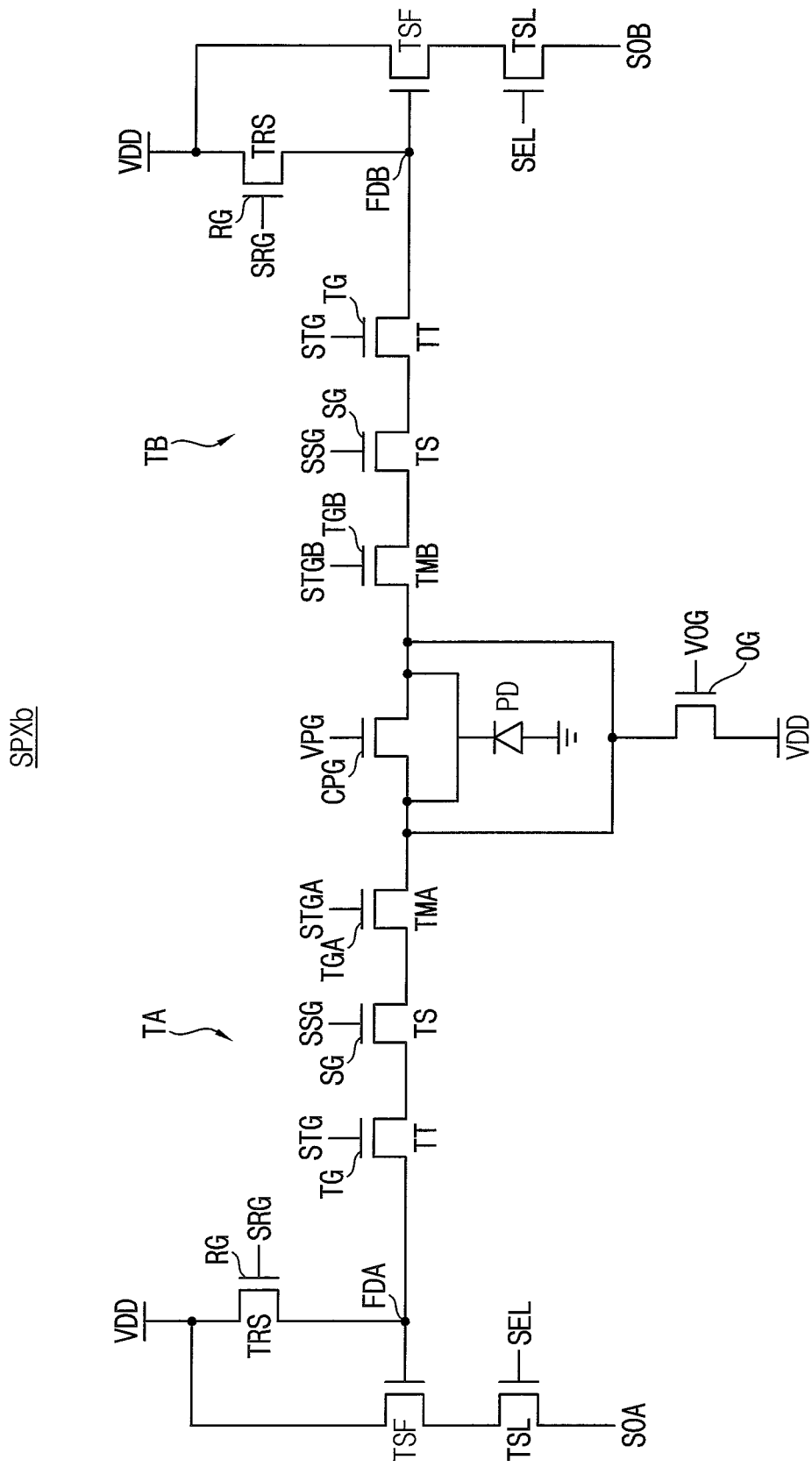
FIG. 15 is a circuit diagram illustrating a sub depth pixel having a two-tap structure in a ToF sensor according to example embodiments.
Figure 16:
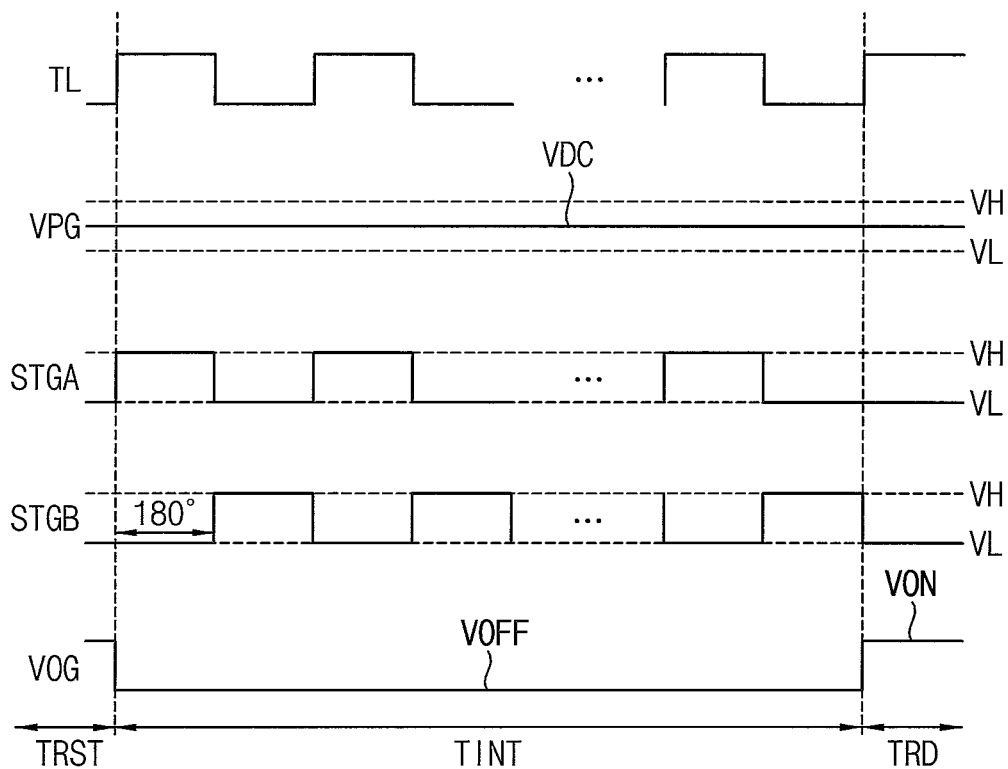
FIG. 16 is a timing diagram illustrating an example embodiment of an operation of a ToF sensor including the sub depth pixel of FIG. 15.

FIG. 15 is a circuit diagram illustrating a sub depth pixel having a two-tap structure in a ToF sensor according to example embodiments, and FIG. 16 is a timing diagram illustrating an example embodiment of an operation of a ToF sensor including the sub depth pixel of FIG. 15. A sub depth pixel SPXb of FIG. 15 is similar to the sub depth pixel SPXa of FIG. 10, and the descriptions repeated with FIGS. 10 and 11 are omitted.

Referring to FIG. 15, the sub depth pixel SPXb may include a common photogate CPG that replaces the first photogate PGA and the second photogate PGB in the sub depth pixel SPXa of FIG. 10.

Referring to FIGS. 15 and 16, during the integration period TINT, a photogate voltage VPG applied to the common photogate CPG may have a DC voltage level VDC that causes collecting of the photo charge, and the overflow gate voltage VOG applied to the overflow gate OG may have a turn-off voltage level VOFF that causes draining of the photo charge to be blocked. The DC voltage level VDC may be a voltage level between a high voltage level VH of the demodulation signals STGA and STGB and a low voltage level VL of the demodulation signals STGA and STGB.

Also during the integration period TINT, the first and second demodulation transfer control signals STGA and STGB of different phases may be applied to the first and second demodulation transfer gates TGA and TGB, respectively. Thus, the first and second demodulation transfer control signals STGA and STGB may correspond to the above-described demodulation signals having different phases in the example embodiment of the sub depth pixel SPXb of FIG. 15. The phase difference between the first and second demodulation signals STGA and STGB may be about 180 degrees.

Figure 17:
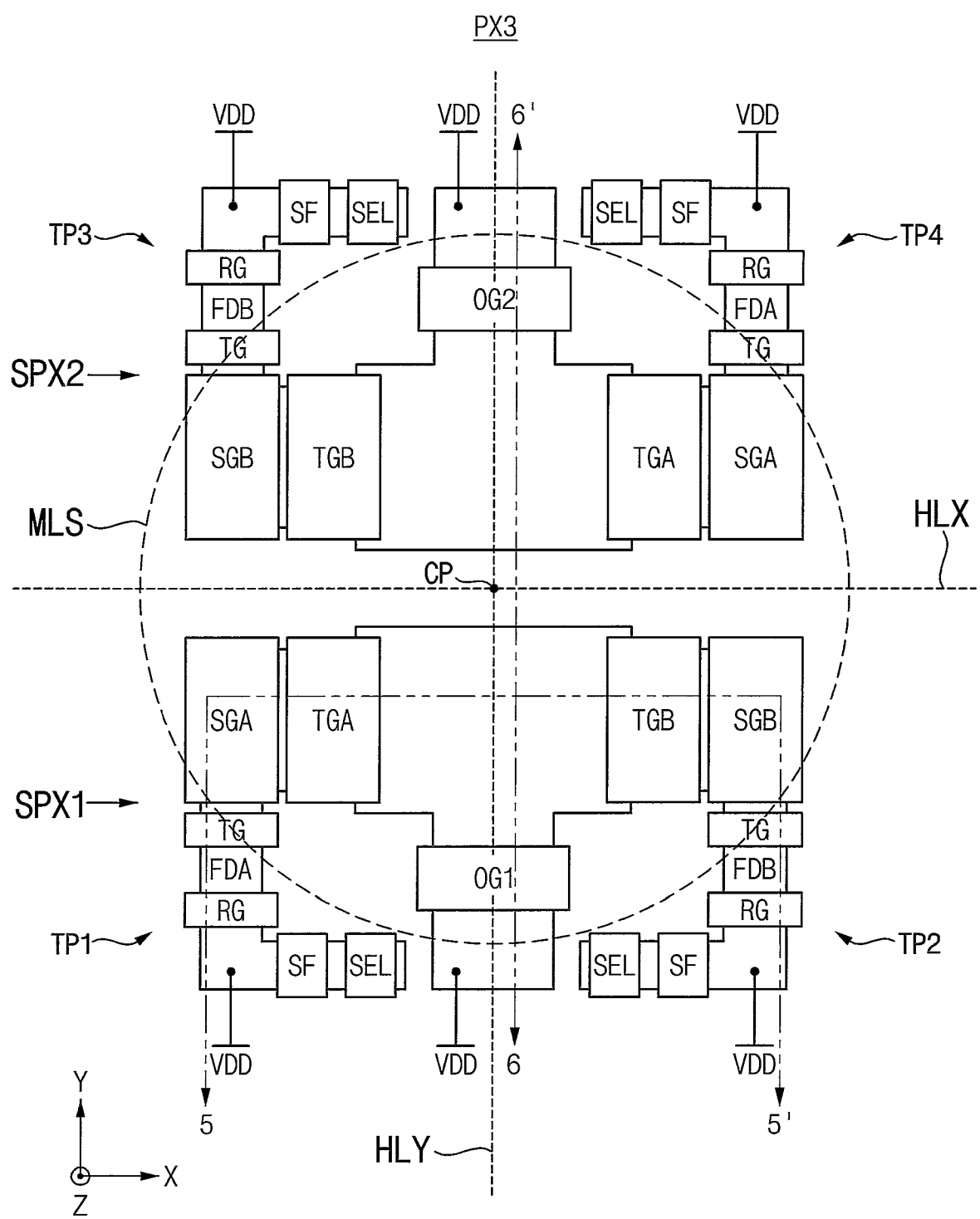
FIG. 17 is a diagram illustrating a layout of a depth pixel according to example embodiments.
Figure 18:
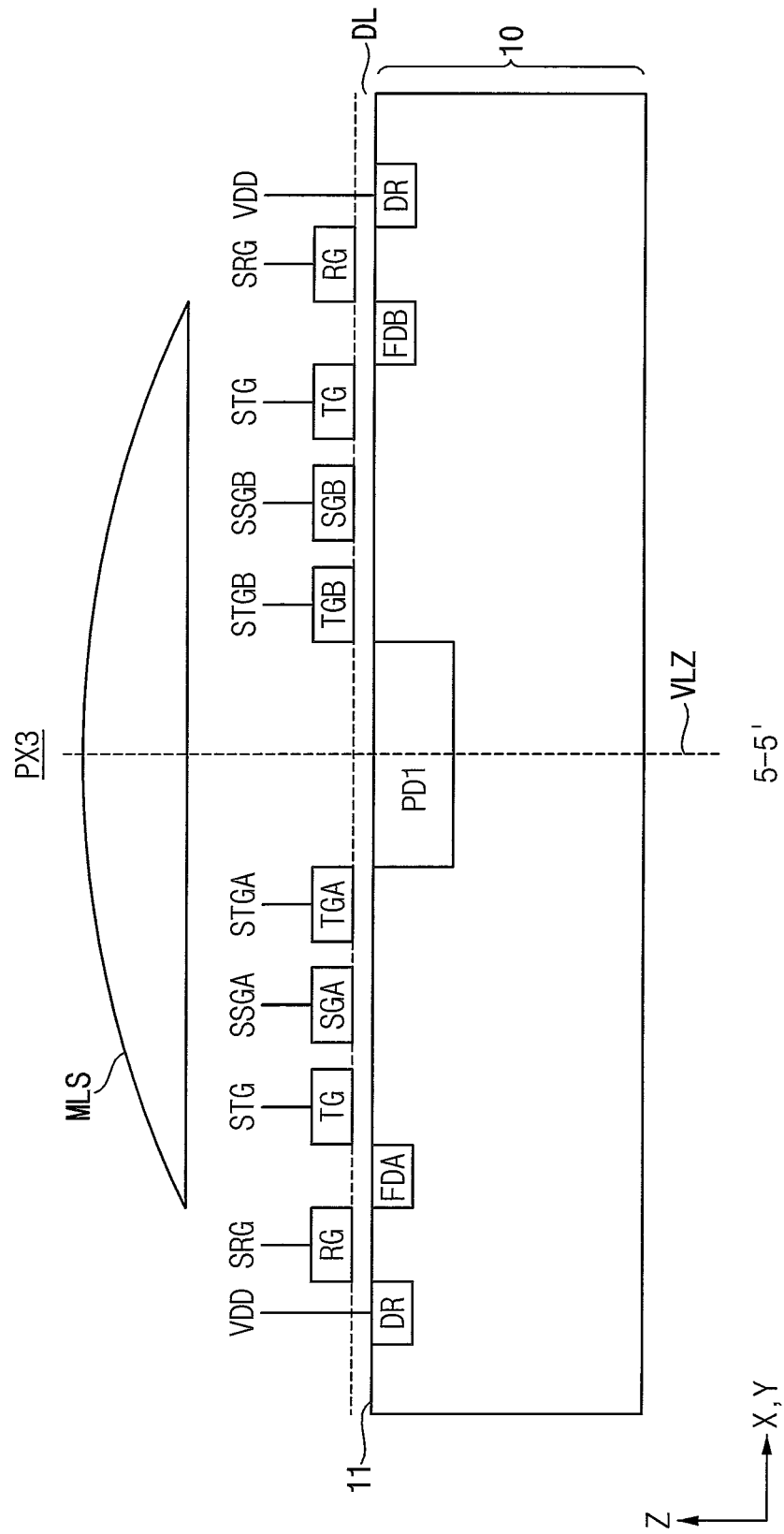
FIGS. 18 and 19 are cross-sectional views illustrating vertical structures of the depth pixel of FIG. 17.
Figure 19:
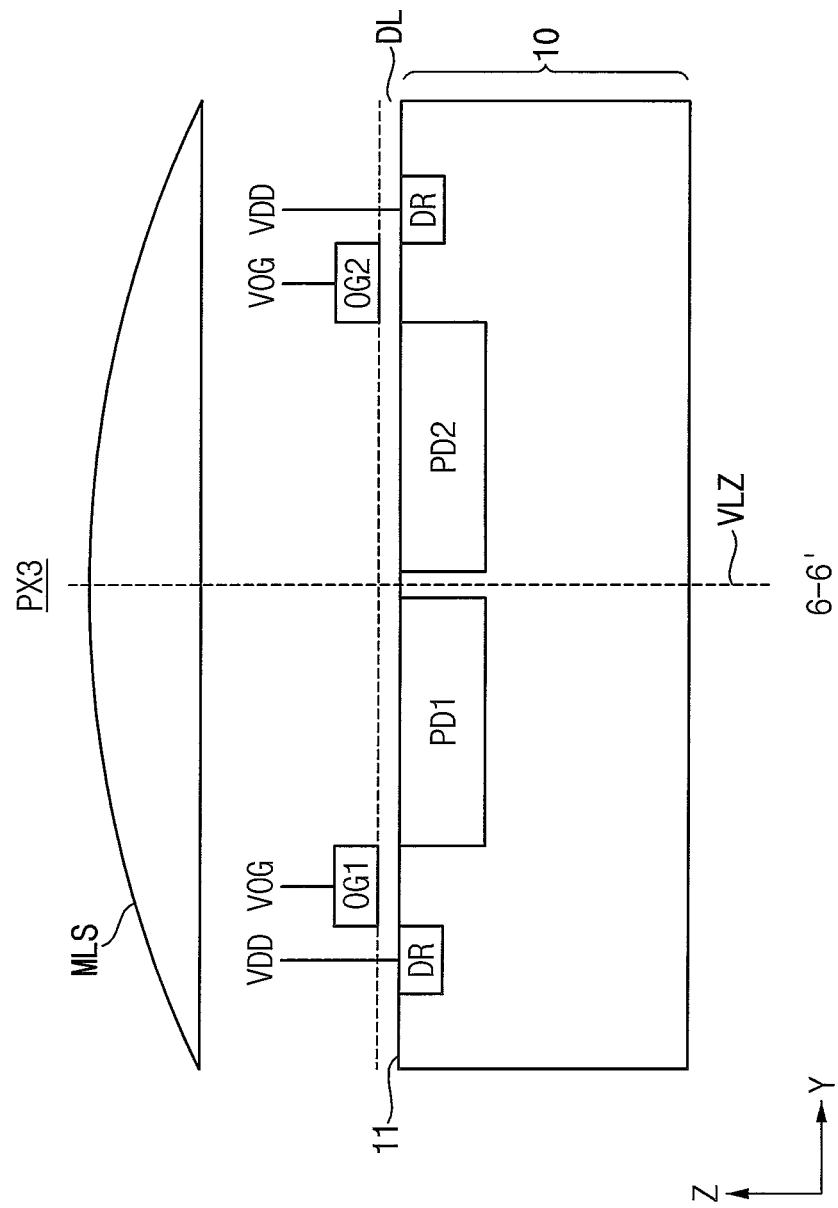

FIG. 17 is a diagram illustrating a layout of a depth pixel according to example embodiments, and FIGS. 18 and 19 are cross-sectional views illustrating vertical structures of the depth pixel of FIG. 17. FIG. 18 is a cross-sectional view of the depth pixel of FIG. 17 along a 5-5' line, and FIG. 19 is a cross-sectional view of the depth pixel of FIG. 17 along a 6-6' line, A depth pixel PX3 of FIGS. 17 through 19 is substantially the same as the depth pixel PX2 of FIGS. 12 through 14, except that the common photogates CPG1 and CPG2 are removed. The repeated descriptions are omitted. The operation of the depth pixel PX3 is substantially the same as described with reference to FIGS. 15 and 16, except the descriptions associated with the common photogates CPG1 and CPG2.

Referring to FIGS. 17 through 19, the depth pixel PX3 may include a first sub depth pixel SPX1 and a second sub depth pixel SPX2. Each of the first sub depth pixel SPX1 and the second sub depth pixel SPX2 may have a two-tap structure. The first sub depth pixel SPX1 may include a first tap TP1 and a second TP2, and the second sub depth pixel SPX2 may include a third tap TP3 and a fourth tap TP4.

The first through fourth taps TP1~TP4 may include demodulation transfer gates TGA and TGB and FD transfer gates TG that are formed above the semiconductor substrate 10, and photodiodes PD1 and PD2, floating diffusion regions FDA and FDB, and drain regions DR that formed in the semiconductor substrate 10.

Demodulation transfer control signals STGA and STGB corresponding to the above-described demodulation signals may be applied to the demodulation transfer gates TGA and TGB. Each of the demodulation transfer gates TGA and TGB may transfer the photo charge in each the photodiodes PD1 and PD2 in response to each of the demodulation signals TGA and TGB. Each of the floating diffusion regions FDA and FDB may store the photo charge transferred through each of the demodulation transfer gates TGA and TGB.

Figure 20A:
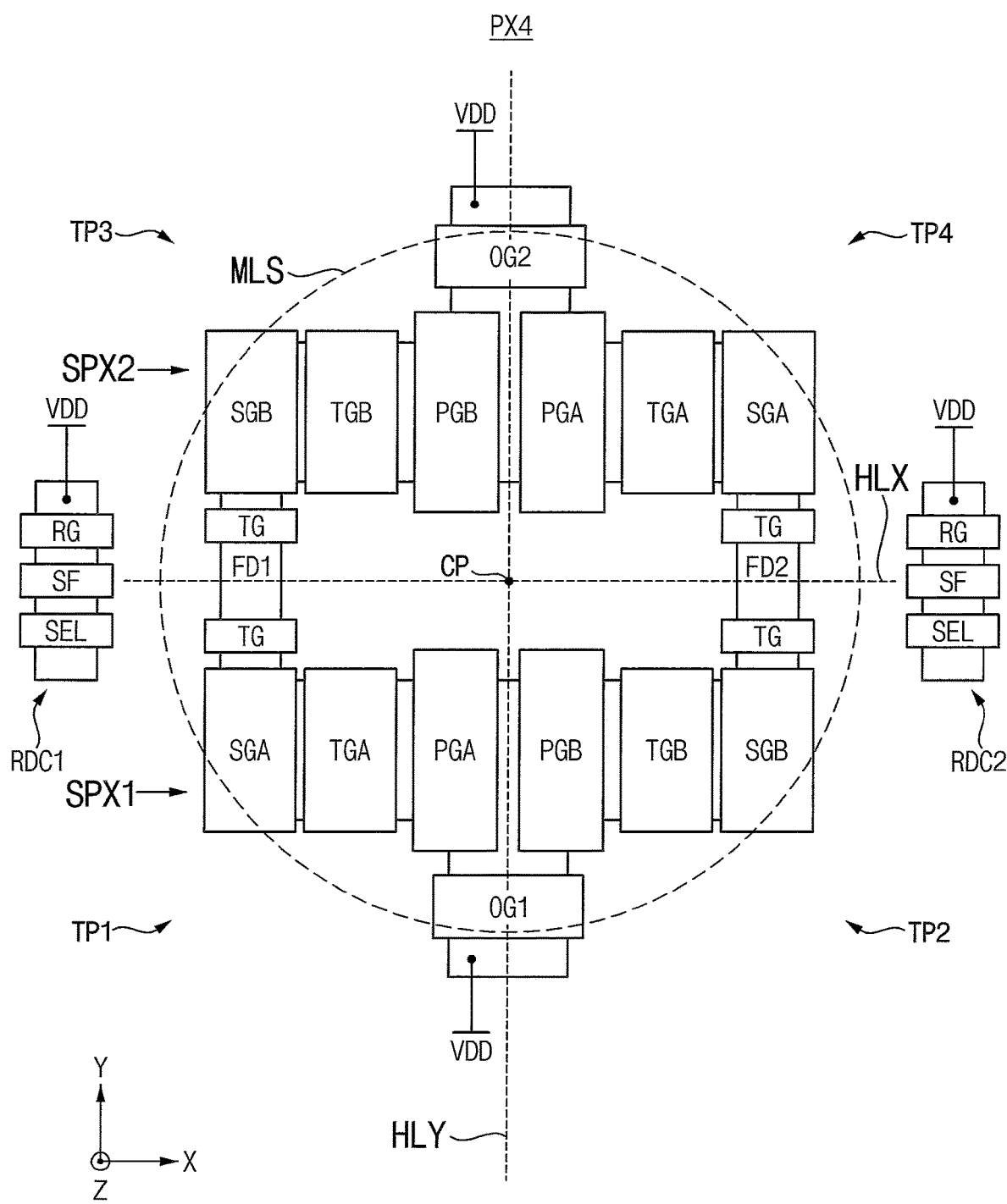
FIGS. 20A and 20B are diagrams illustrating a layout of a depth pixel according to example embodiments.
Figure 20B:
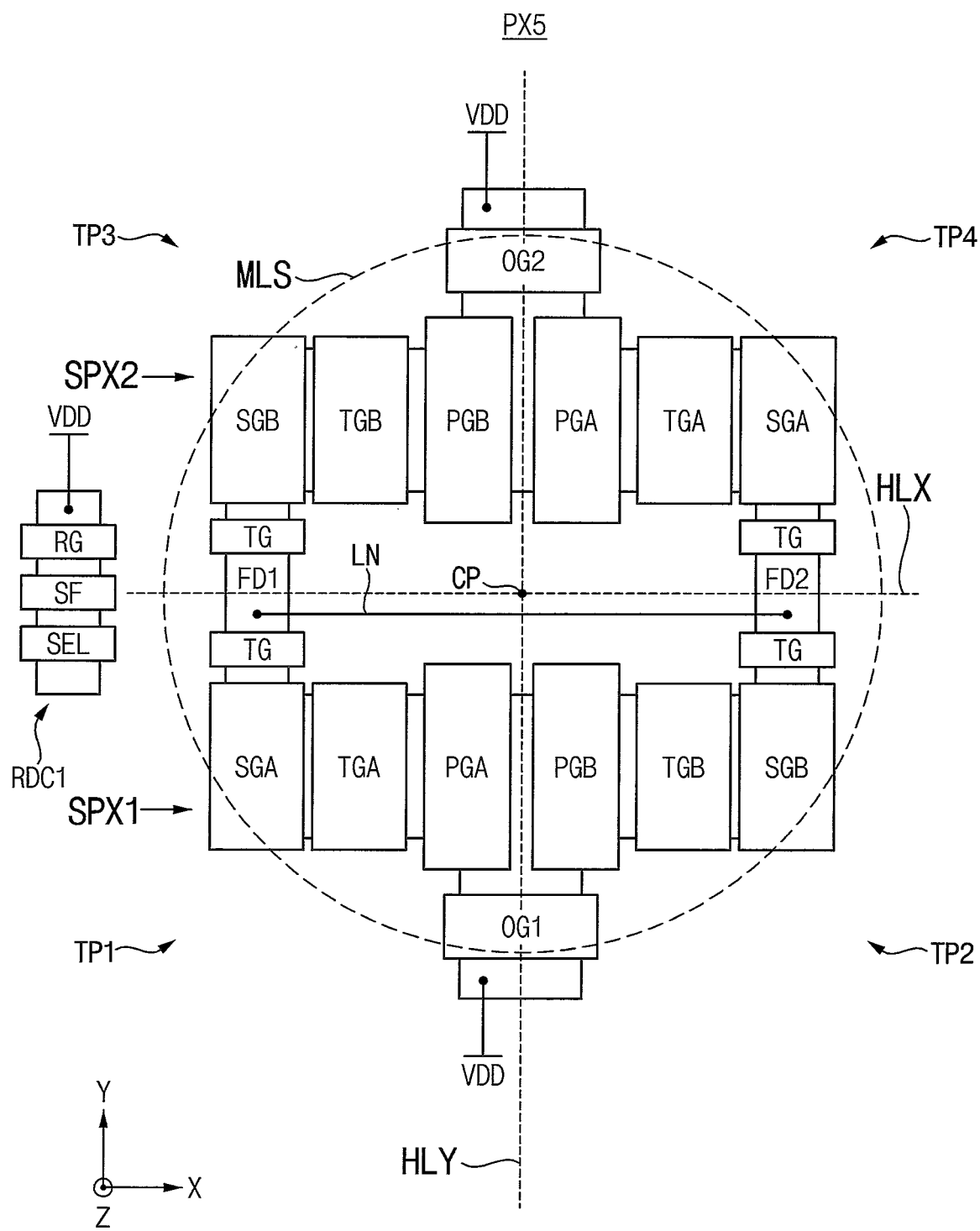

FIGS. 20A and 20B are diagrams illustrating a layout of a depth pixel according to example embodiments. The descriptions repeated with the descriptions as above are omitted.

Referring to FIG. 20A, a depth pixel PX4 may have a structure such that the first tap TP1 of the first sub depth pixel SPX1 and the third tap TP3 of the second sub depth pixel SPX2 may share a first floating diffusion region FD1, and the second tap TP2 of the first sub depth pixel SPX1 and the fourth tap TP4 of the second sub depth pixel SPX2 may share a second floating diffusion region FD2. As such, two taps of different sub depth pixels may share one floating diffusion node. The depth pixel PX 4 may include a first readout circuit RDC1 configured to read out the photo charge stored in the first floating diffusion region FD1, and a second readout circuit RDC2 configured to read out the photo charge stored in the second floating diffusion region FD2.

Referring to FIG. 20B, a depth pixel PX5 may include a conduction line LN disposed above the semiconductor substrate 10 to electrically connect the first floating diffusion region FD1 and the second floating diffusion region FD2. In this case, the four taps TP1~TP4 may share what is effectively one floating diffusion region, and the depth pixel PX5 may include a signal readout circuit RDC1.

Figure 21A:
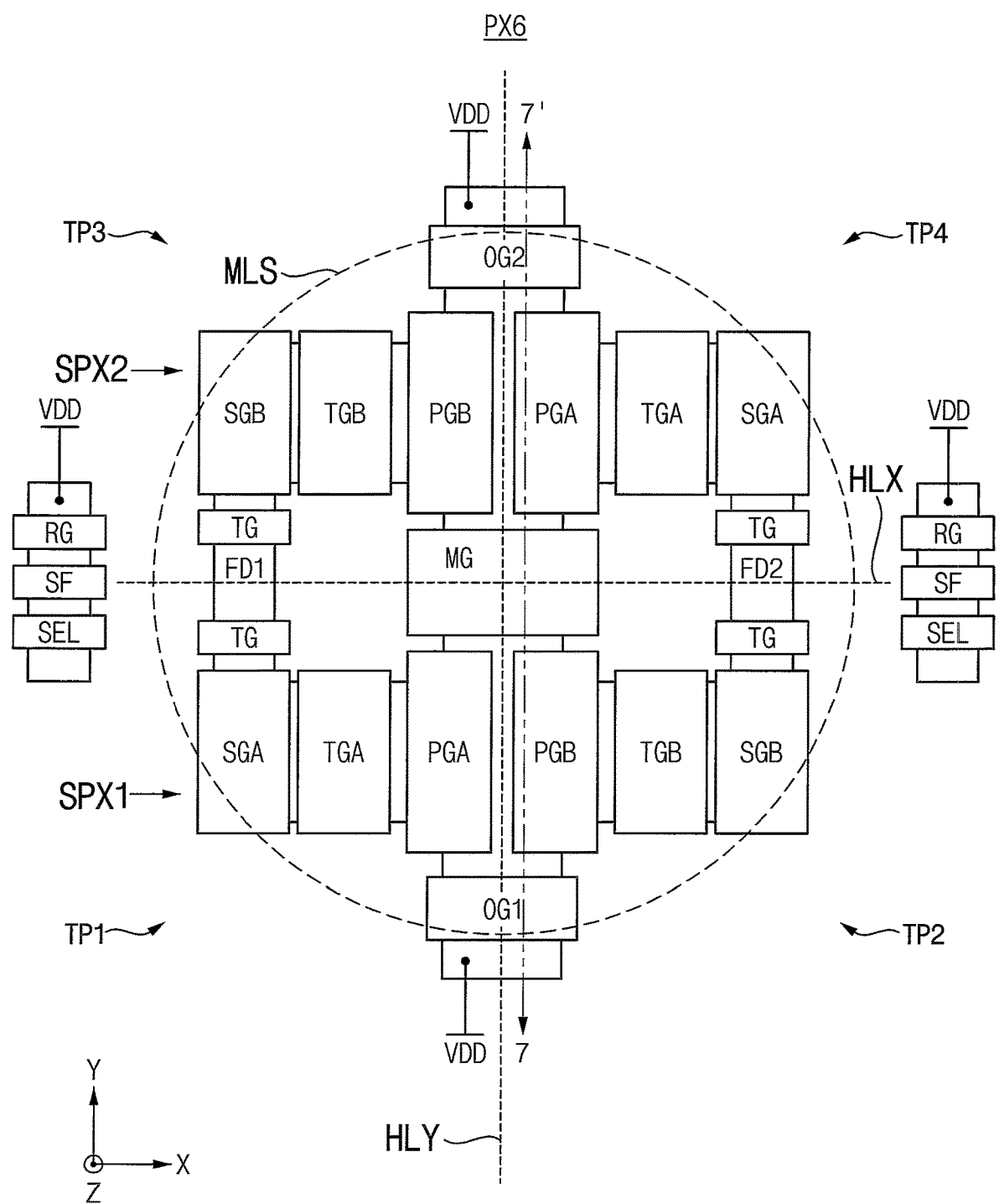
FIG. 21A is a diagram illustrating a layout of a depth pixel according to example embodiments.
Figure 21B:
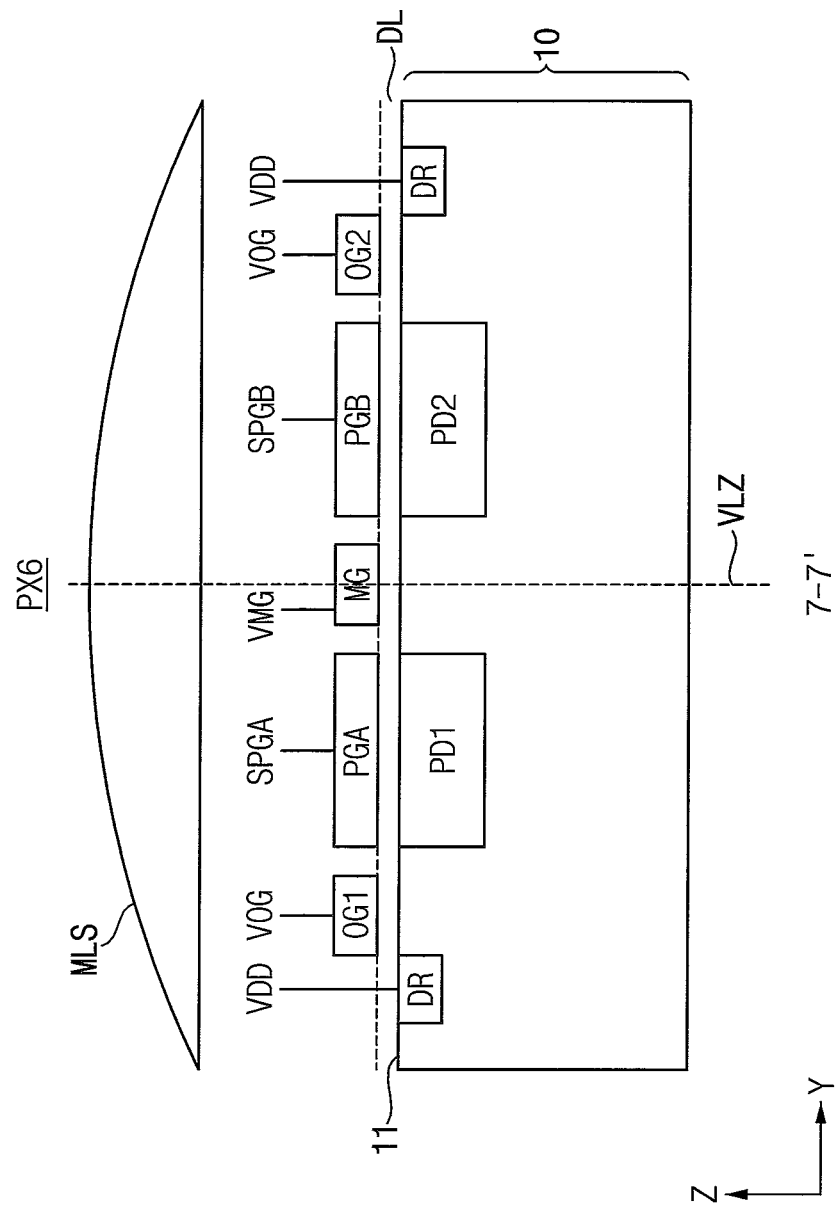
FIG. 21B is a cross-sectional view illustrating vertical structures of the depth pixel of FIG. 21A.

FIG. 21A is a diagram illustrating a layout of a depth pixel according to example embodiments, and FIG. 21B is a cross-sectional view illustrating vertical structures of the depth pixel of FIG. 21A. FIG. 21B is a cross-sectional view of the depth pixel of FIG. 17 along a 7-7' line.

A depth pixel PX6 of FIGS. 21A and 21B is substantially the same as the depth pixel PX4 of FIG. 20A, except that the depth pixel PX 6 further includes a middle gate MG. The repeated descriptions are omitted.

Referring to FIGS. 21A and 21B, the depth pixel PX6 may include the middle gate MG disposed between the first photodiode PD1 and the second photodiode PD2.

A middle gate voltage VMG may be applied to the middle gate MG during an auto focusing mode to adjust a focus to the object, at which time the middle gate voltage VMG may have a turn-on voltage level to electrically connect the first photodiode PD1 and the second photodiode PD2. In contrast, the middle gate voltage VMG during a distance measurement mode to measure a distance to the object may have a turn-off voltage level to electrically disconnect the first photodiode PD1 from the second photodiode PD2.

Figure 22:
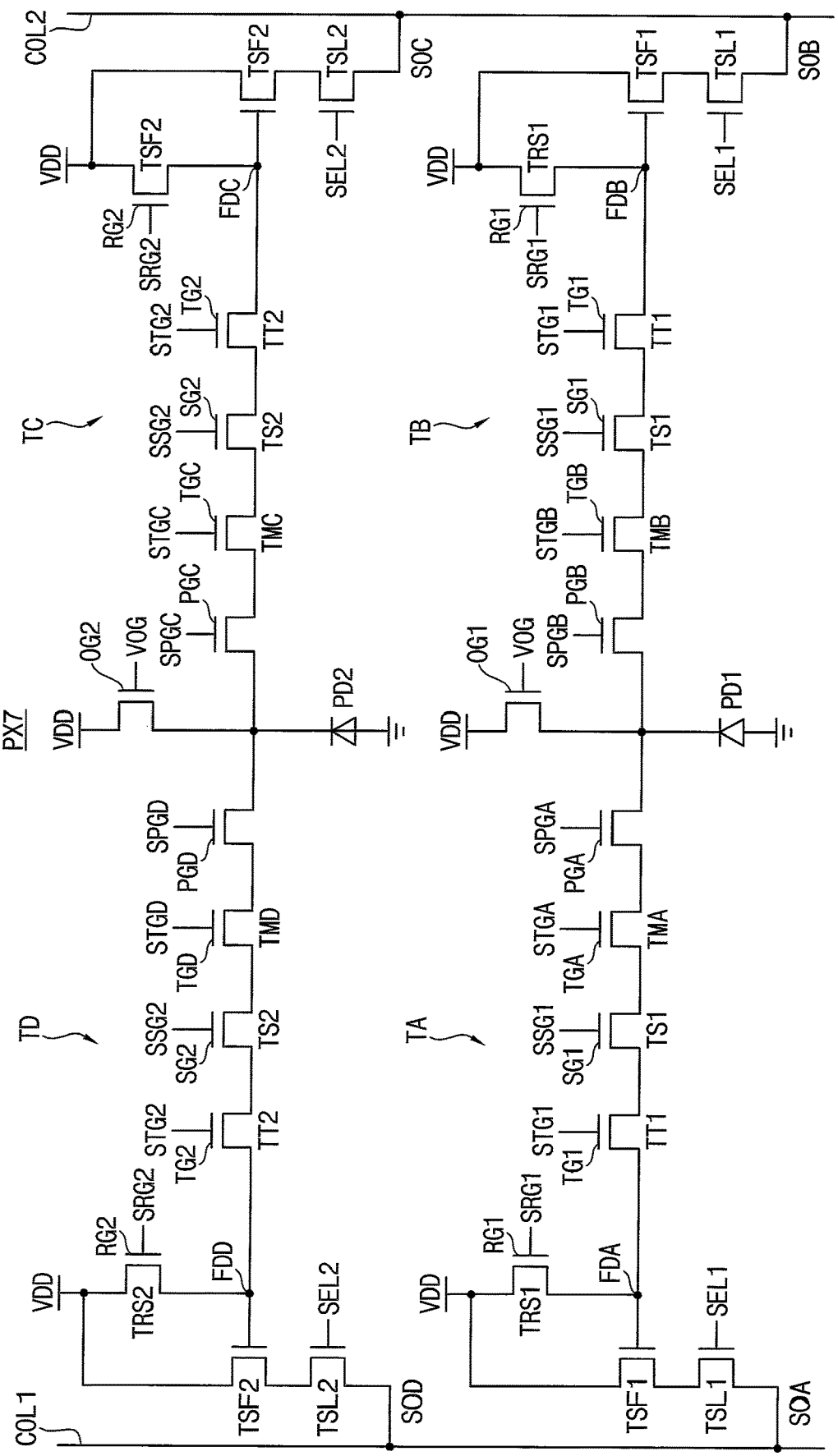
FIG. 22 is a circuit diagram illustrating a depth pixel having a four-tap structure included in a ToF sensor according to example embodiments.
Figure 23:
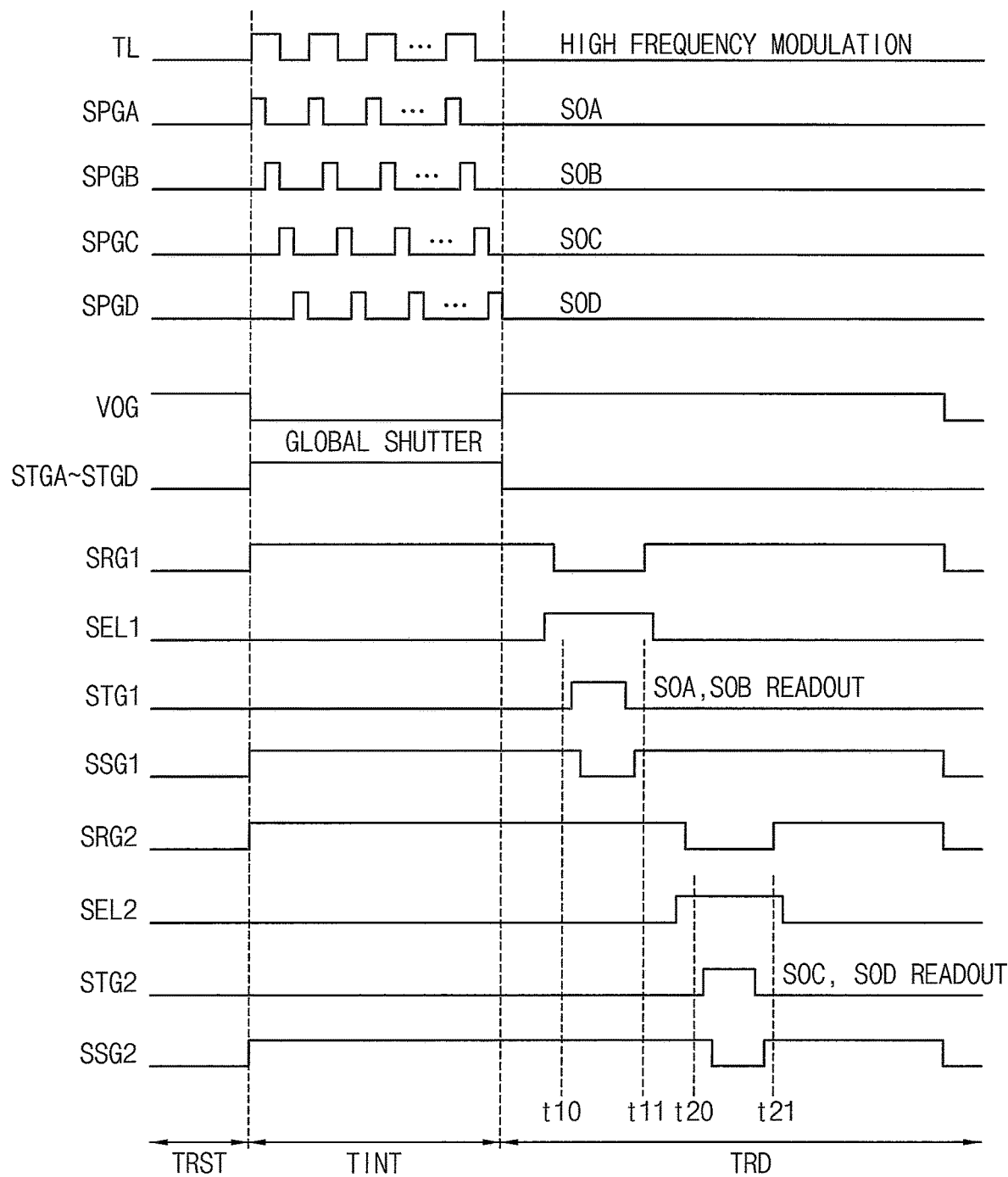
FIG. 23 is a timing diagram illustrating an example embodiment of an operation of a ToF sensor including the depth pixel of FIG. 22.

FIG. 22 is a circuit diagram illustrating a depth pixel having a four-tap structure included in a ToF sensor according to example embodiments, and FIG. 23 is a timing diagram illustrating an example embodiment of an operation of a ToF sensor including the depth pixel of FIG. 22.

FIG. 22 illustrates an example embodiment corresponding to the structure having an individual photogate per tap of FIGS. 7 through 11 and the pattern PTT3 of applying the demodulation signals of FIG. 6. The descriptions repeated with FIGS. 10 and 11 may be omitted.

Referring to FIG. 22, a depth pixel PX7 may include a first photogate PGA and transistors TMA, TS1, and TT1 corresponding to a first tap TA, a second photogate PGB and transistors TMB, TS1, and TT1 corresponding to a second tap TB, a third photogate PGC and transistors TMC, TS2, and TT2 corresponding to a third tap TC, a fourth photogate PGD and transistors TMD, TS2, and TT2 corresponding to a fourth tap TD, and transistors TRS1, TRS2, TSF1, TSF2, TSL1, and TSL2 corresponding to readout circuits.

Each of the transistors TMA, TMB, TMC, TMD, TS1, TS2, TT1, TT2, TRS1, and TRS2 may include a gate disposed above a semiconductor substrate and source and drain regions disposed at respective sides of the gate in the semiconductor substrate. The gates of the transistors TMA, TMB, TMC, TMD, TS1, TS2, TT1, TT2, TRS1 may correspond to a first demodulation transfer gate TGA, a second demodulation transfer gate TGB, a third demodulation transfer gate TGC, a fourth demodulation transfer gate TGD, storage gates SG, FD transfer gates TG, and reset gates RG1 and RG2, respectively.

First through fourth photogate signals SPGA~SPGD are applied to the first through fourth photogates PGA~PGD, an overflow gate voltage VOG is applied to the overflow gates OG1 and OG2, storage control signals SSG1 and SSG2 are applied to the storage gates SG1 and SG2, demodulation transfer control signals STGA~STGD are applied to the demodulation transfer gates TGA~TGD, FD transfer control signals STG1 and STG2 are applied to FD transfer gates TG1 and TG2, reset signals SRG1 and SRG2 are applied to the reset gates RG1 and RG2, and selection signals SEL1 and SEL2 are applied to the gates of the selection transistors TSL1 and TSL2. The first through fourth photogate signals SPGA~SPGD correspond to the above-described demodulation signals having different phases.

The photogate signals SPGA~SPGD, the overflow gate voltage VOG, the demodulation transfer control signals STGA~STGD, the storage control signals SSG1 and SSG2, the FD transfer control signals STG1 and STG2, the reset signals SRG1 and SRG2, and the selection signals SEL1 and SEL2 may be provided from the row scanning circuit 130 under control of the controller 150 as described above with reference to FIG. 2.

Referring to FIGS. 2, 22, and 23, the light source 210 may generate the transmission light TL modulated by a modulation frequency during an integration period TINT, to collect a photo charge generated by the reflection light RL. The row scanning circuit 130 may apply the first through fourth sampling control signals (e.g., the first through fourth photogate signals SPGA~SPGD having the different phases) to the first through fourth photogates PGA~PGD corresponding to the first through fourth taps TA~TD.

The overflow voltage VOG applied to the overflow gates OG1 and OG2 may have a turn-off voltage level VOFF to block the photo charge from being drained from the photodiode PD during the integration period TINT. The demodulation transfer control signals STGA~STGD and the storage control signals SSG1 and SSG2 are activated during the integration period TINT. Accordingly, the photo charge collected by the first through fourth photogate signals SPGA~SPGD may be stored in the semiconductor substrate under the storage gates SG1 and SG2, respectively.

During other periods (e.g., a reset period TRST to initialize the depth pixel PX1 and a readout period TRD to measure an amount of the photo charge collected during the integration period TINT), the overflow gate voltage VOG may have a turn-on voltage level VON to drain the photo charge from the photodiode PD. The collected photo charge may be drained to the terminal of the power supply voltage VDD during the periods TRST and TRD other than the integration period TINT. As such, a global shutter function may be implemented using the overflow gates OG.

At a first time point t10, during the readout period TRD when the reset signal SRG1 is deactivated and the selection signal SEL1 is activated, first and second reset state data of the first and second taps TA and TB may be output through column lines COL1 and COL2, respectively. At a second time point t11, during the readout period TRD when the FD transfer control signal STG1 is activated and the storage control signal SSG1 is deactivated, the photo charge stored by the storage gates SG may be transferred to the floating diffusion regions FDA and FDB and the first and second sampled data SOA and SOB of the first and second taps TA and TB may be output through the column lines COL1 and COL2, respectively.

At a third time point t20, during the readout period TRD when the reset signal SRG2 is deactivated and the selection signal SEL2 is activated, third and fourth reset state data of the third and fourth taps TC and TD may be output through the column lines COL1 and COL2, respectively. At a fourth time point t21, during the readout period TRD when the FD transfer control signal STG2 is activated and the storage control signal SSG2 is deactivated, the photo charge stored by the storage gates SG may be transferred to floating diffusion regions FDC and FDD and the third and fourth sampled data SOC and SOD of the third and fourth taps TC and TD may be output through the column lines COL1 and COL2, respectively.

During a distance measurement mode of measuring a distance to the object, the distance may be measured based on differences between the first through fourth sampled data SOA, SOB, SOC, and SOD corresponding to different phases. In contrast, during an auto focusing mode of adjusting a focus to the object, the focus to the object may be adjusted based on a difference between a first sum SOA+SOB of the sample data corresponding to the first photodiode PD1 of the first sub depth pixel and a second sum SOC+SOD of the sample data corresponding to the second photodiode PD2 of the second sub pixel.

As such, using the depth pixel including two sub depth pixels sharing one common microlens CML, and respectively having a two-tap structure, the information for the distance measurement and the information for the auto focusing may be obtained simultaneously and the distance information may be extracted regardless of the ambient light.

Figure 24:
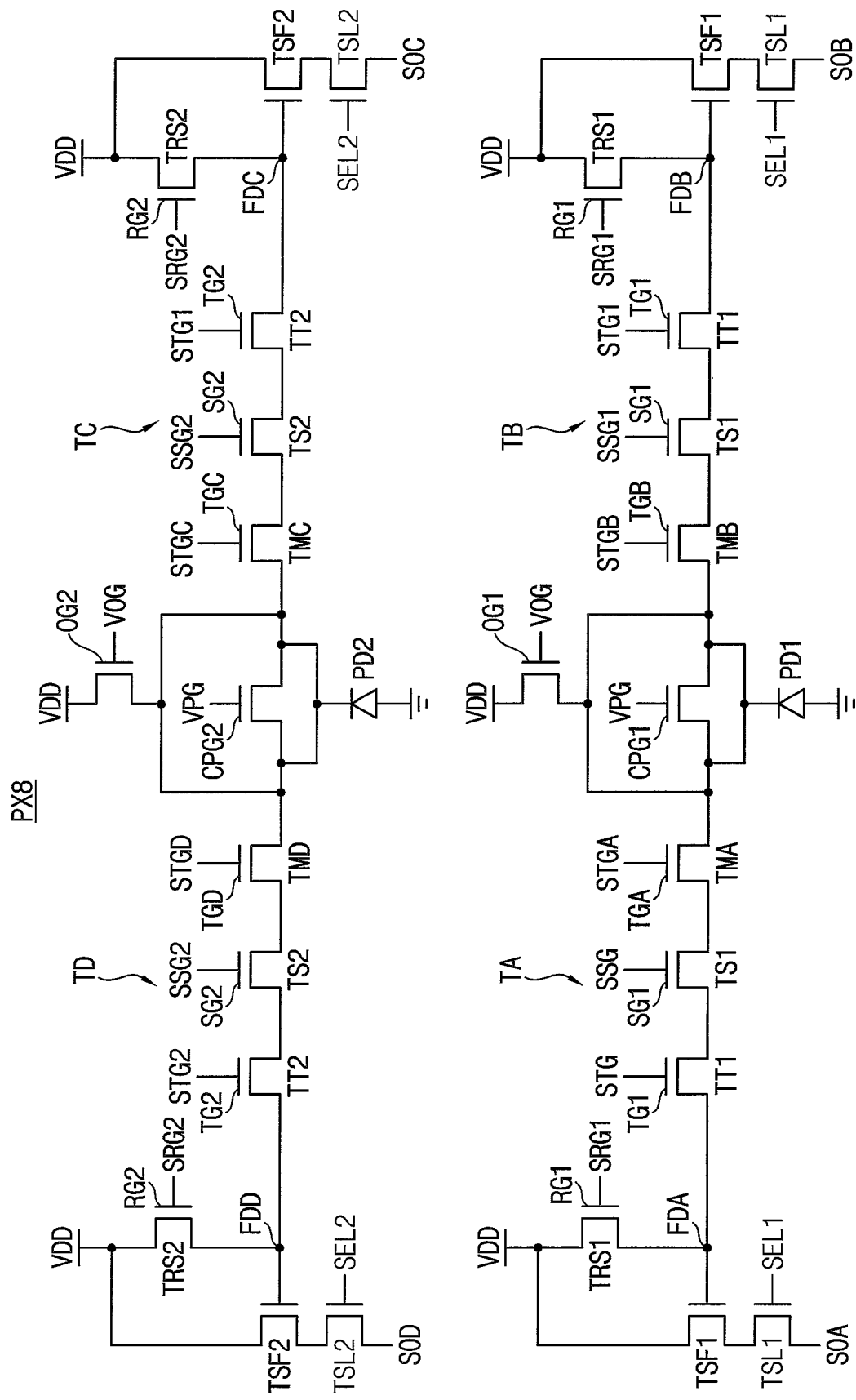
FIG. 24 is a circuit diagram illustrating a depth pixel having a four-tap structure included in a ToF sensor according to example embodiments.
Figure 25:
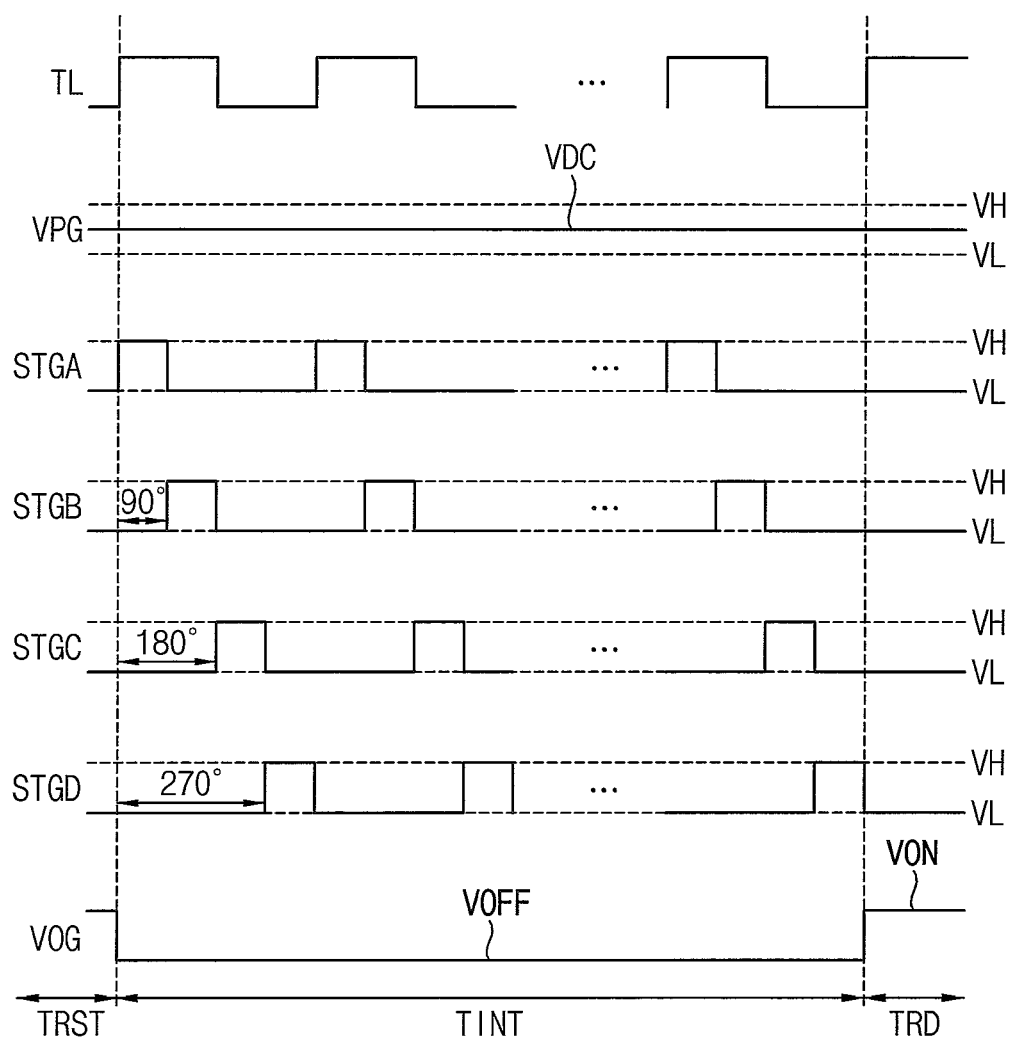
FIG. 25 is a timing diagram illustrating an example embodiment of an operation of a ToF sensor including the depth pixel of FIG. 24.

FIG. 24 is a circuit diagram illustrating a depth pixel having a four-tap structure included in a ToF sensor according to example embodiments, and FIG. 25 is a timing diagram illustrating an example embodiment of an operation of a ToF sensor including the depth pixel of FIG. 24. A depth pixel PX8 of FIG. 24 is similar to the depth pixel PX7 of FIG. 22, and the repeated descriptions are omitted.

Referring to FIG. 24, the depth pixel PX8 includes common photogates CPG1 and CPG2 (instead of the first through fourth photogates PGA~PGD of the depth pixel PX7 of FIG. 22). In the case of depth pixel PX8 of FIG. 24, the first through fourth demodulation transfer control signal STGA~STGD may correspond to the above-described demodulation signals.

Referring to FIGS. 24 and 25, during the integration period TINT, a photogate voltage VPG applied to the common photogates CPG1 and CPG2 may have a DC voltage level VDC that causes collecting of the photo charge. The overflow gate voltage VOG applied to the overflow gates OG1 and OG2 may have a turn-off voltage level VOFF that causes draining of the photo charge to be blocked. The DC voltage level VDC may be a voltage level between a high voltage level VH of the demodulation signals STGA~STGD and a low voltage level VL of the demodulation signals STGA~STGD.

In addition, during the integration period TINT, the first through fourth demodulation signals STGA~STGD of different phases may be applied to the first through fourth demodulation transfer gates TGA~TGD, respectively. The phase difference between the first and second demodulation signals STGA and STGB may be about 90 degrees, the phase difference between the first and third demodulation signals STGA and STGC may be about 180 degrees, and the phase difference between the first and fourth demodulation signals STGA and STGD may be about 270 degrees.

FIGS. 26 through 30 are layouts of a depth pixel according to example embodiments.

Referring to FIGS. 26 through 30, a pixel array may be implemented with various combinations of the depth pixels PXa and PXb of FIG. 5.

Figure 26:
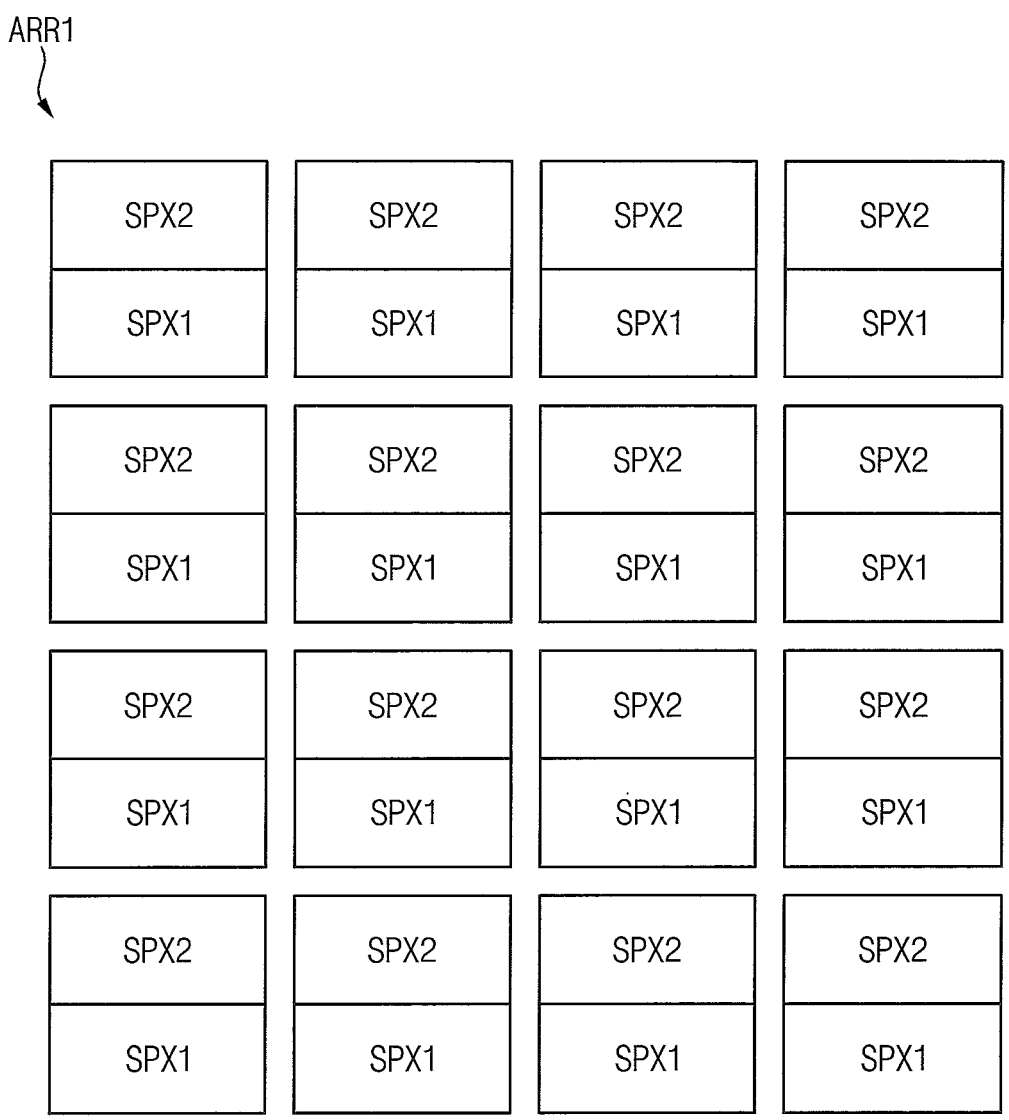
FIGS. 26 through 30 are layouts of a depth pixel according to example embodiments.

Referring to FIG. 26, a pixel array ARR1 may be implemented with the depth pixels PXa alone.

Figure 27:
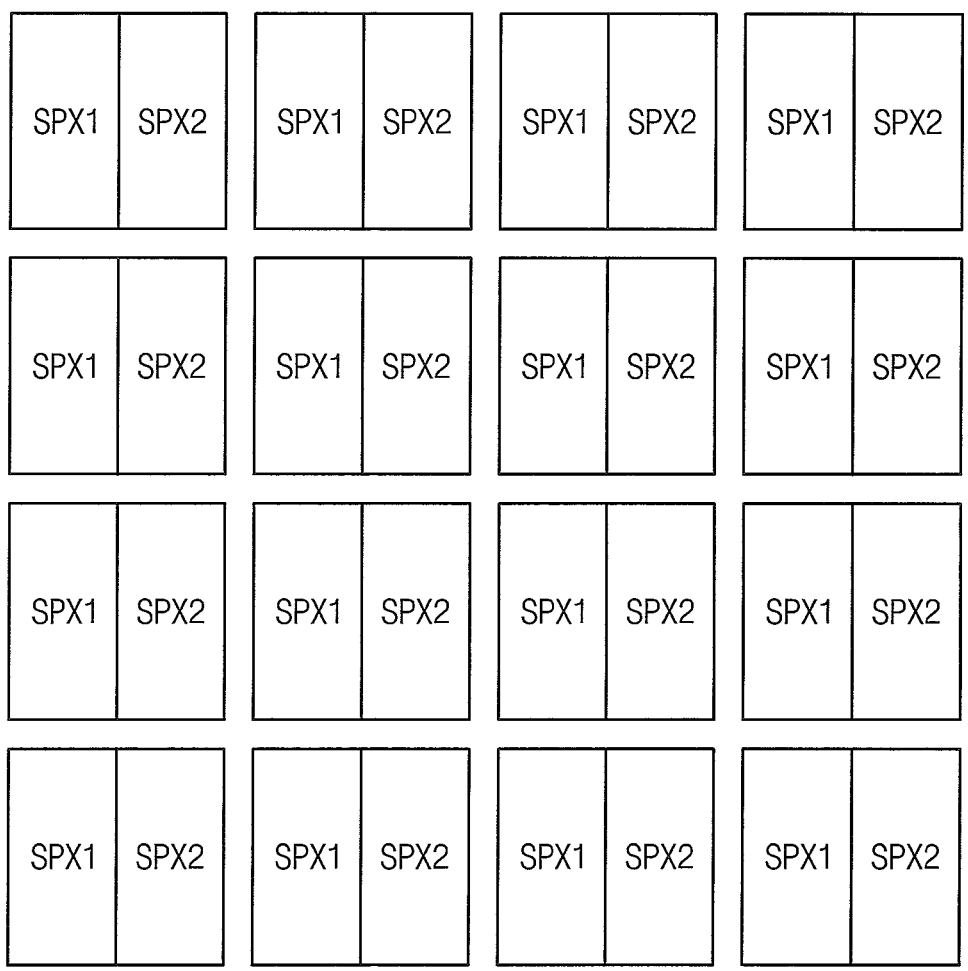

Referring to FIG. 27, a pixel array ARR2 may be implemented with the depth pixels PXb alone.

Figure 28:
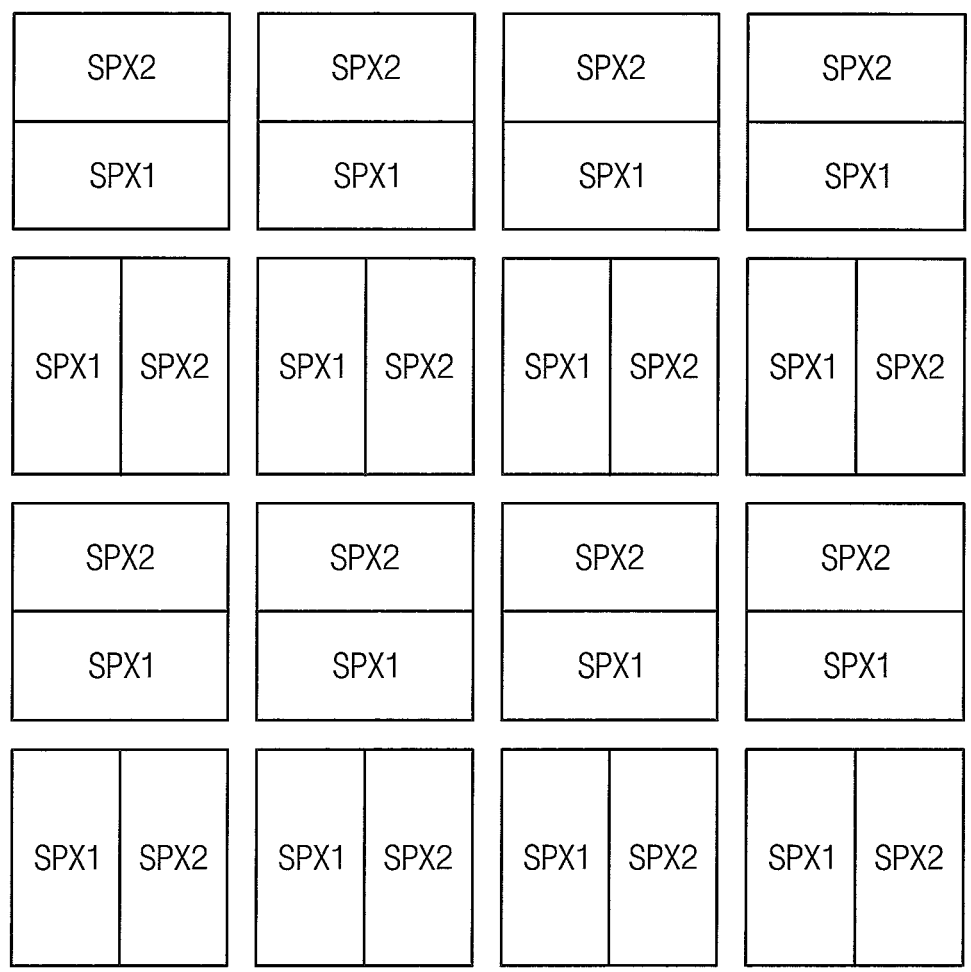

Referring to FIG. 28, a pixel array ARR3 may be implemented such that rows of the depth pixels PXa and rows of the depth pixels PXb are arranged alternately row by row.

Figure 29:
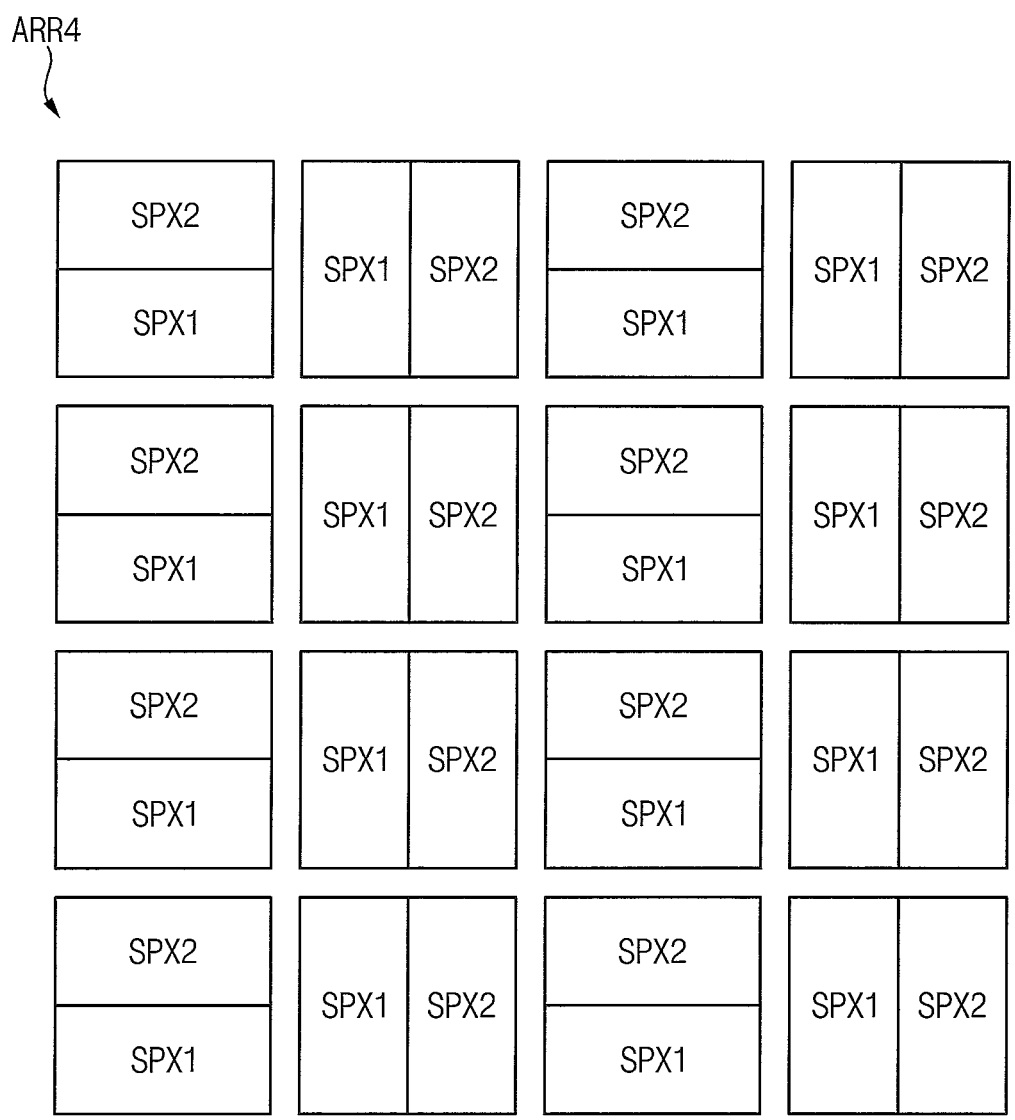

Referring to FIG. 29, a pixel array ARR4 may be implemented such that columns of the depth pixels PXa and columns of the depth pixels PXb are arranged alternately column by column.

Figure 30:
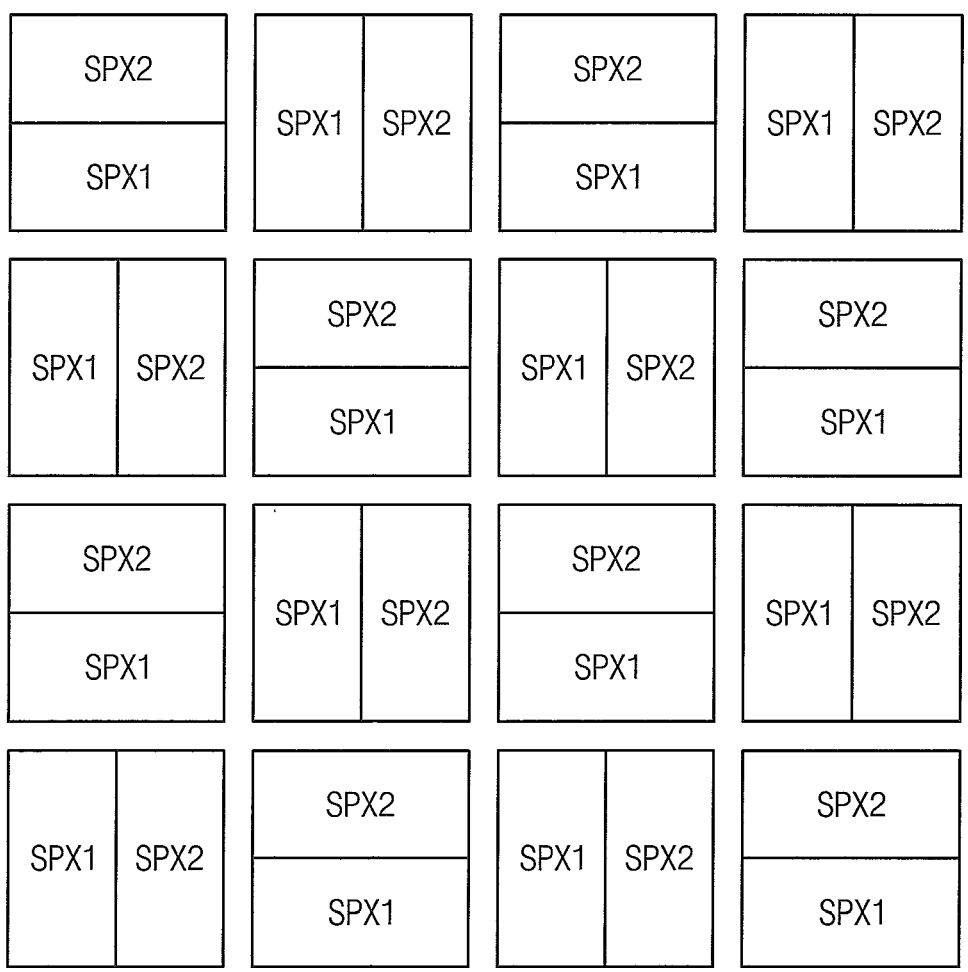

Referring to FIG. 30, a pixel array ARR5 may be implemented such that the depth pixels PXa and the depth pixels PXb are disposed alternately row by row and column by column, that is, arranged in a checkerboard pattern.

FIGS. 31 through 36 are cross-sectional diagrams illustrating a depth pixel according to example embodiments.

FIGS. 31 through 36 illustrate structures corresponding to a back-side illumination (BSI) such that a light is incident through a lower surface 12 of a semiconductor substrate SUB.

Referring to FIGS. 31 through 36, each of depth pixels PX51~PX56 may include photogates PG and overflow gates OG disposed adjacent to an upper surface 11 of the semiconductor substrate SUB, and a common microlens MLS disposed adjacent to the lower surface 12 of the semiconductor substrate SUB.

Each of the depth pixels PX51~PX56 may include an anti-reflection layer RFL and a planarization layer PNL. The anti-reflection layer RFL may be disposed adjacent to the lower surface 12 of the semiconductor substrate SUB where a light is incident through the lower surface 12 of the semiconductor substrate SUB. The anti-reflection layer RFL may reflect light that is scattered and/or reflected inside the semiconductor substrate SUB, and thus, the sensing sensitivity may be increased by causing the light to reside longer in the semiconductor substrate SUB. The anti-reflection layer RFL may have a stack structure of fixed charge layers and oxides. The anti-reflection layer RFL may be an insulating film of high permittivity, and may be manufactured by an atomic layer deposition (ALD) process. The anti-reflection layer RFL may be implemented with hafnium oxide, aluminum oxide, titanium oxide, strontium titan oxide, etc.

The planarization layer PNL may be disposed adjacent to a lower surface of the anti-reflection layer RFL. The planarization layer PNL may be implemented with silicon oxide, silicon nitride, silicon oxynitride, etc.

The microlens MLS may be disposed adjacent to a lower surface of the planarization layer PNL. The light focused by the microlens may be concentrated on the photodiodes PD1 and PD2. The microlens MLS may be implemented with styrol resin, acrylate resin, siloxane resin, etc.

Each of the depth pixels PX51~PX56 may include a pixel isolation structure extending in the vertical direction Z substantially perpendicular to the lower surface 12 of the semiconductor substrate SUB, and located in boundary regions of the depth pixel so as to block light from other depth pixels. The pixel isolation structure may block light from other depth pixels.

Figure 31:
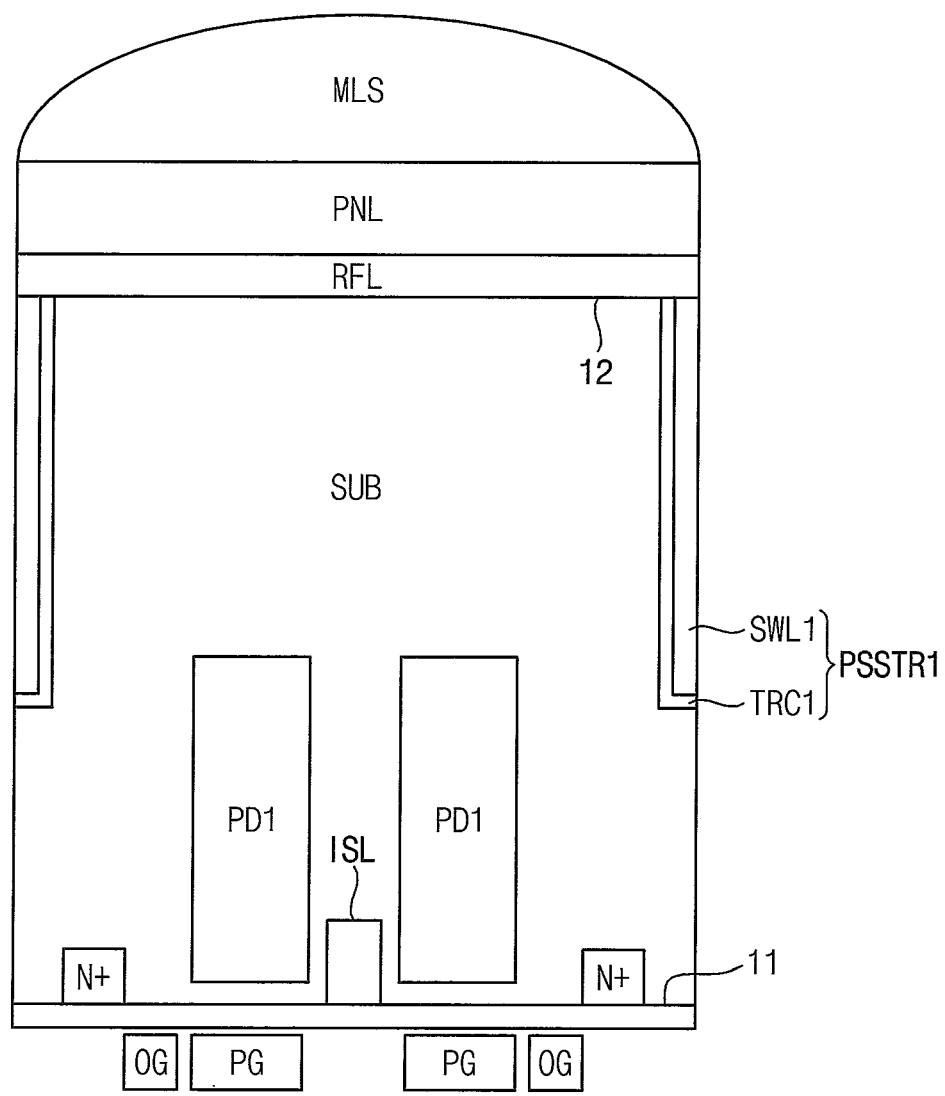
FIGS. 31 through 36 are cross-sectional diagrams illustrating a depth pixel according to example embodiments.

In some example embodiments, referring to FIG. 31, the depth pixel PX51 may include a back-side isolation structure PSSTR1 extending in the vertical direction Z from the lower surface 12 of the semiconductor substrate SUB. A trench TRC1 may be formed to a predetermined depth, and a side wall SWL1 may be formed in the trench TRC1. The side wall SWL1 may block the light from penetrating to the adjacent pixels. The side wall SWL1 may be implemented with at least one material similar to that of the anti-reflection material RFL. The trench TRC1 may be filled with at least one dielectric material.

Figure 32:
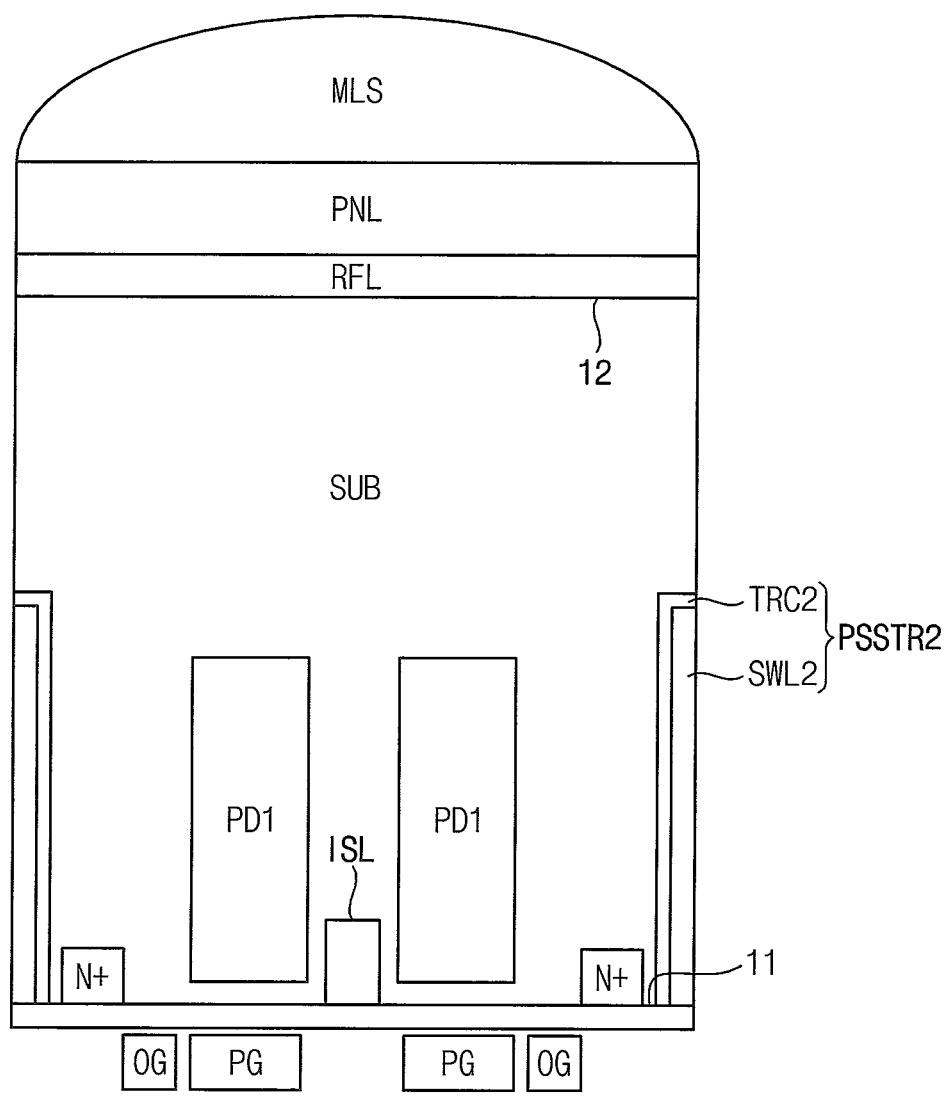

In some example embodiments, referring to FIG. 32, the depth pixel PX52 may include a front-side isolation structure PSSTR2 extending in the vertical direction Z from the upper surface 11 of the semiconductor substrate SUB. The front-side isolation structure PSSTR2 may include a trench TRC2 and a side wall SWL2.

Figure 33:
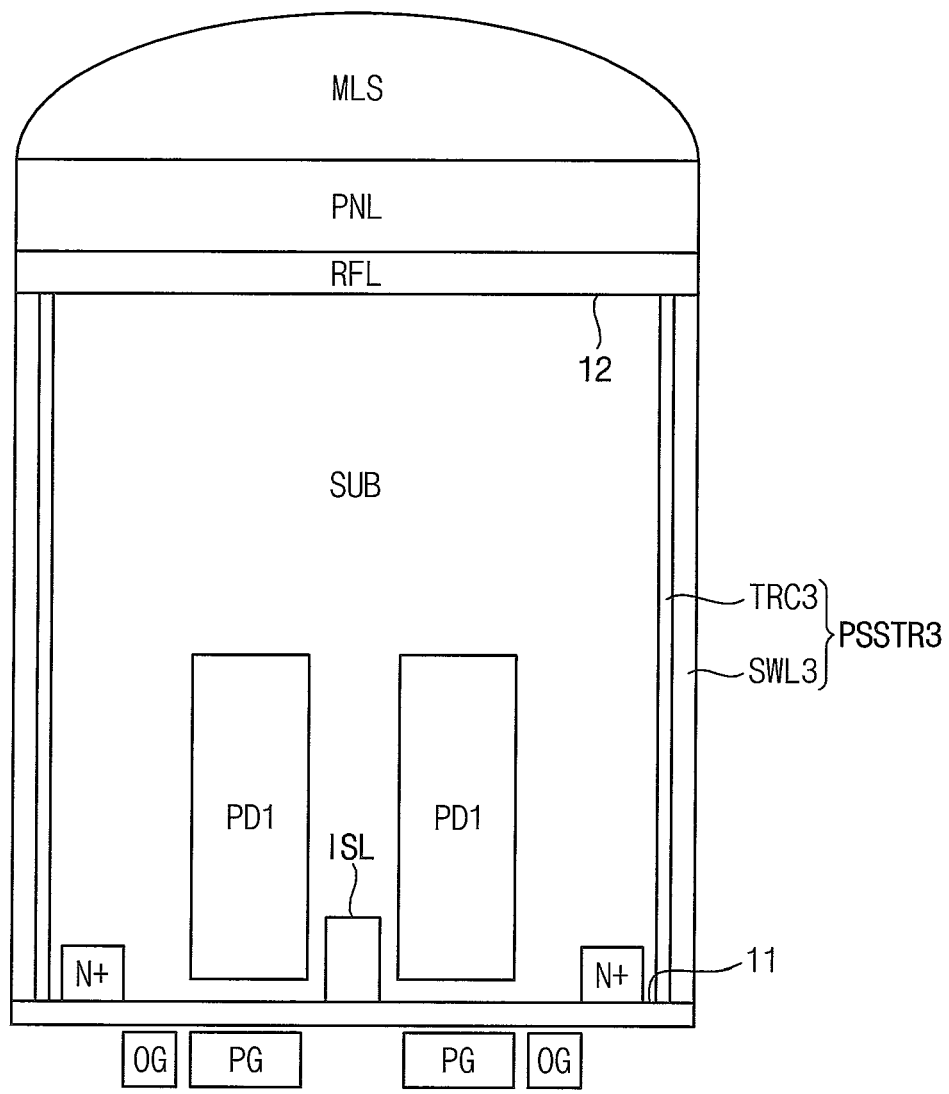

In some example embodiments, referring to FIG. 33, the depth pixel PX53 may include a full isolation structure PSSTR3 extending in the vertical direction Z from the upper surface 11 to the lower surface 12 of the semiconductor substrate SUB. The full isolation structure PSSTR3 may include a trench TRC3 and a side wall SWL3.

Figure 34:
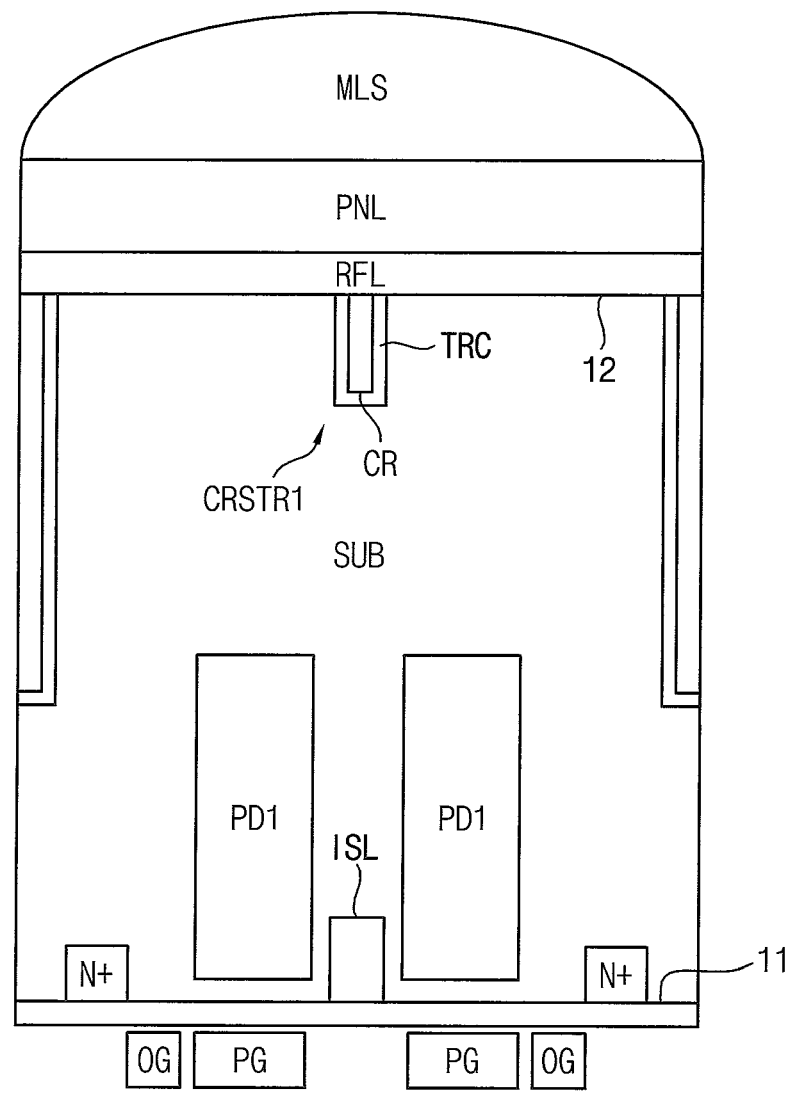
Figure 35:
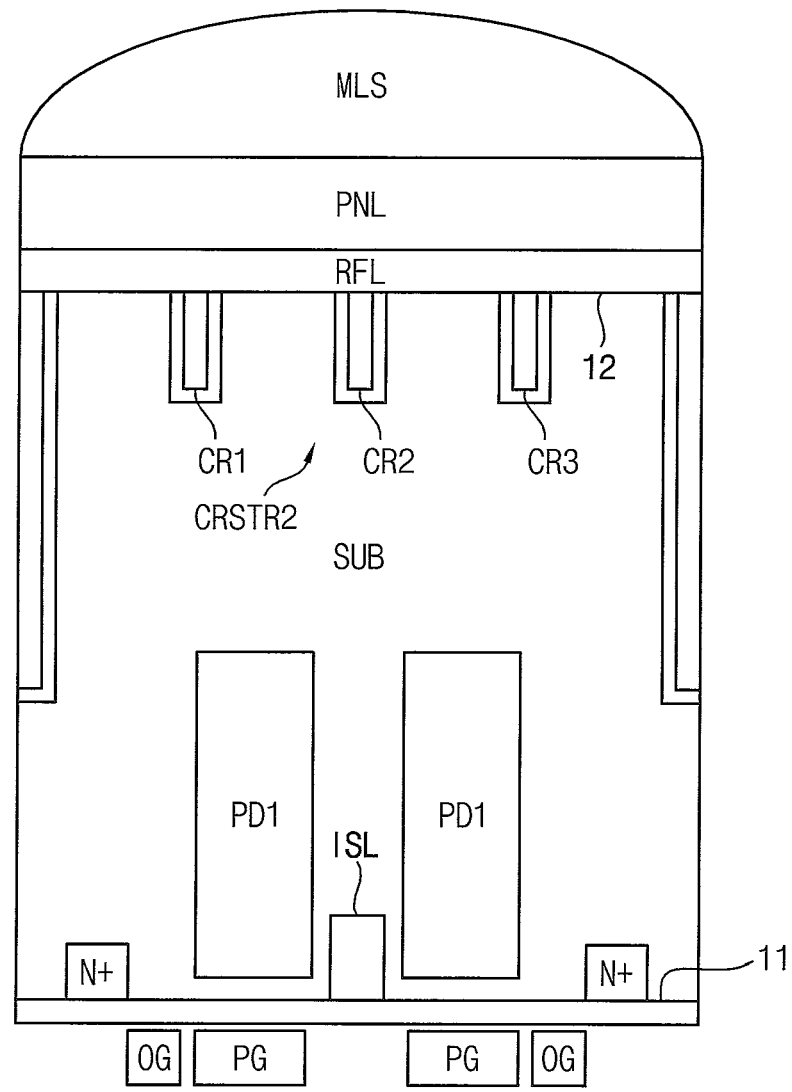
Figure 36:
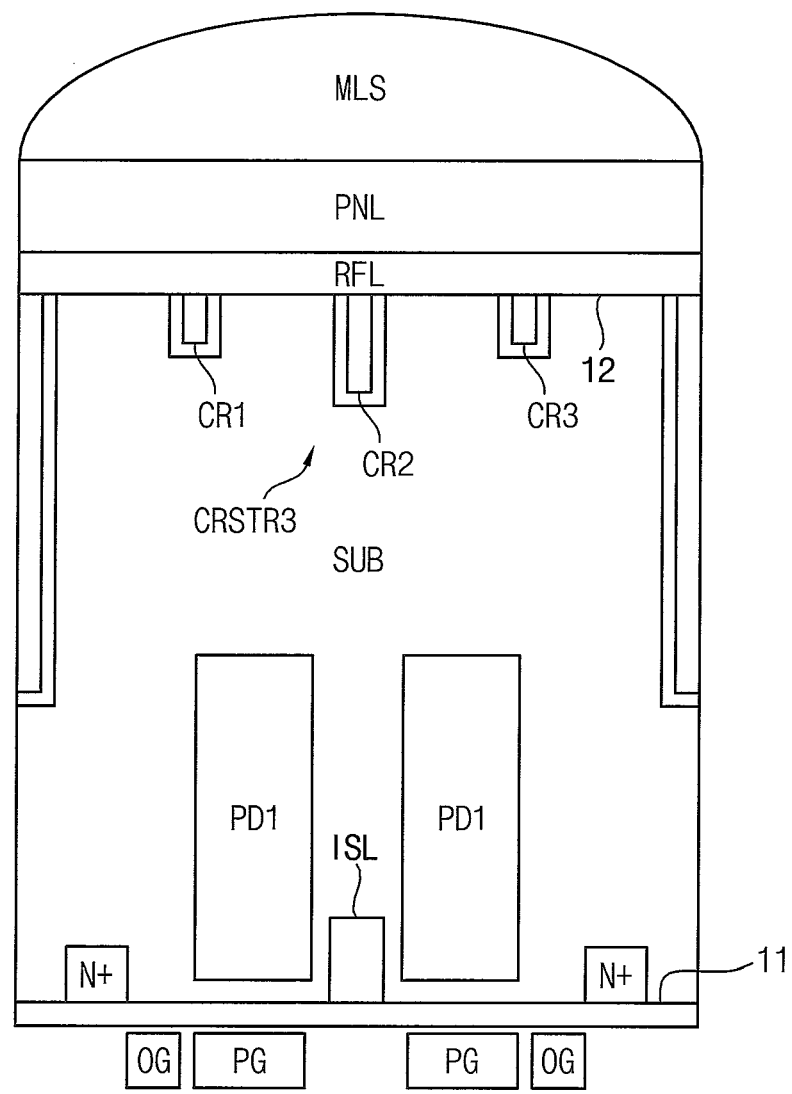

Referring to FIGS. 34 through 36, each of depth pixels PX54~PX56 may include a corrugated structure disposed adjacent to the upper surface of the anti-reflection layer RFL to induce reflection and scattering of a light.

In some example embodiments, referring to FIG. 34, a corrugated structure CRSTR1 may include a single ridge CR formed in a trench TRC.

In some example embodiments, referring to FIG. 35, a corrugated structure CRSTR2 may include a plurality of ridges CR1~CR3.

In some example embodiments, referring to FIG. 36, a corrugated structure CRSTR3 may include a plurality of ridges CR1~CR3 having different depths from each other.

The ridges CR and CR1~CR3 may also be referred to as protrusions.

Figure 37:
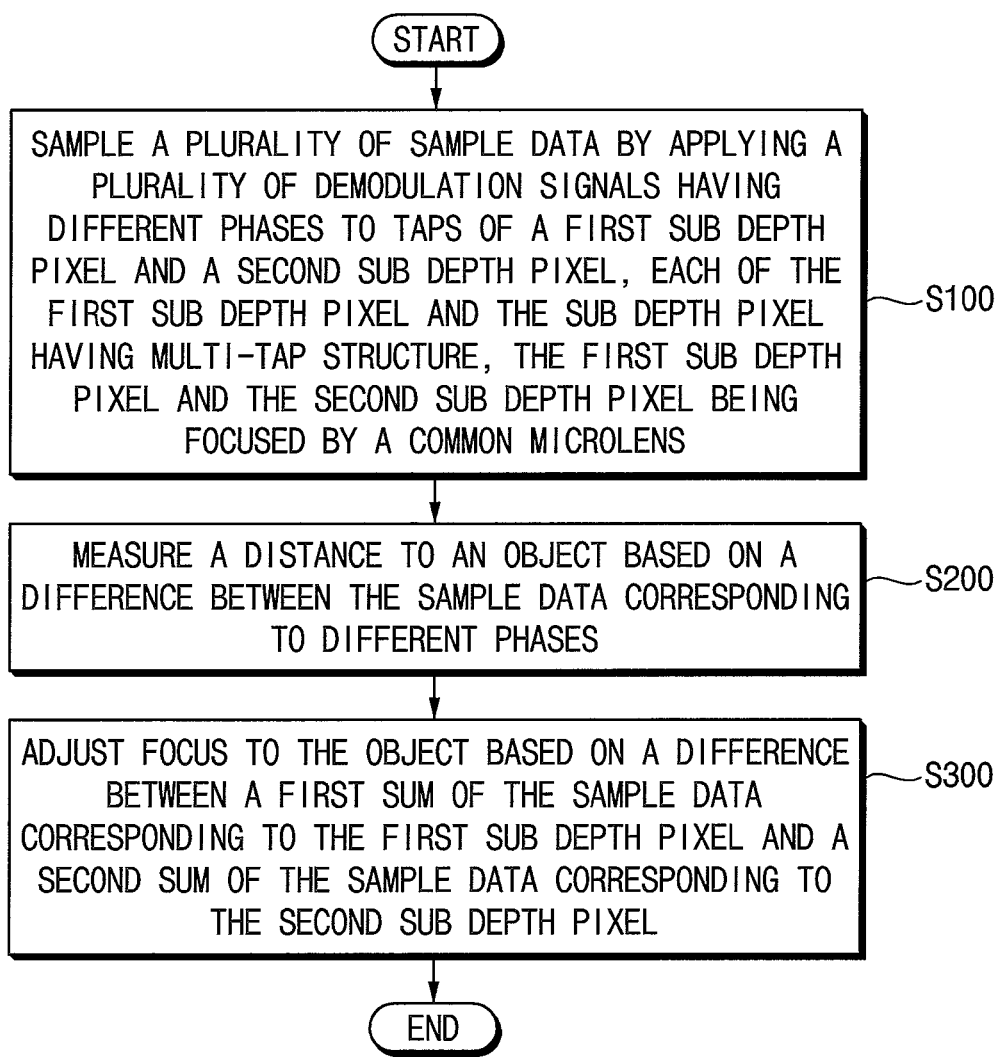
FIG. 37 is a flow chart illustrating a method of operating a ToF sensor according to example embodiments.

FIG. 37 is a flow chart illustrating a method of operating a ToF sensor according to example embodiments.

Referring to FIG. 37, a plurality of sample data may be sampled by applying a plurality of demodulation signals having different phases to taps of a first sub depth pixel and a second sub depth pixel, where each of the first sub depth pixel and the second sub pixel has multi-tap structure, and the first sub depth pixel and the second sub pixel are focused by a common microlens (S100).

A distance to an object may be measured based on a difference between the sample data corresponding to different phases (S200).

Focus to the object may be adjusted based on a difference between a first sum of the sample data corresponding to the first sub depth pixel and a second sum of the sample data corresponding to the second sub pixel (S300).

As such, using the depth pixel including two sub depth pixels sharing one common microlens CIVIL and respectively having a two-tap structure, the information for the distance measurement and the information for the auto focusing may be obtained simultaneously, and the distance information may be extracted regardless of the ambient light.

Figure 38:
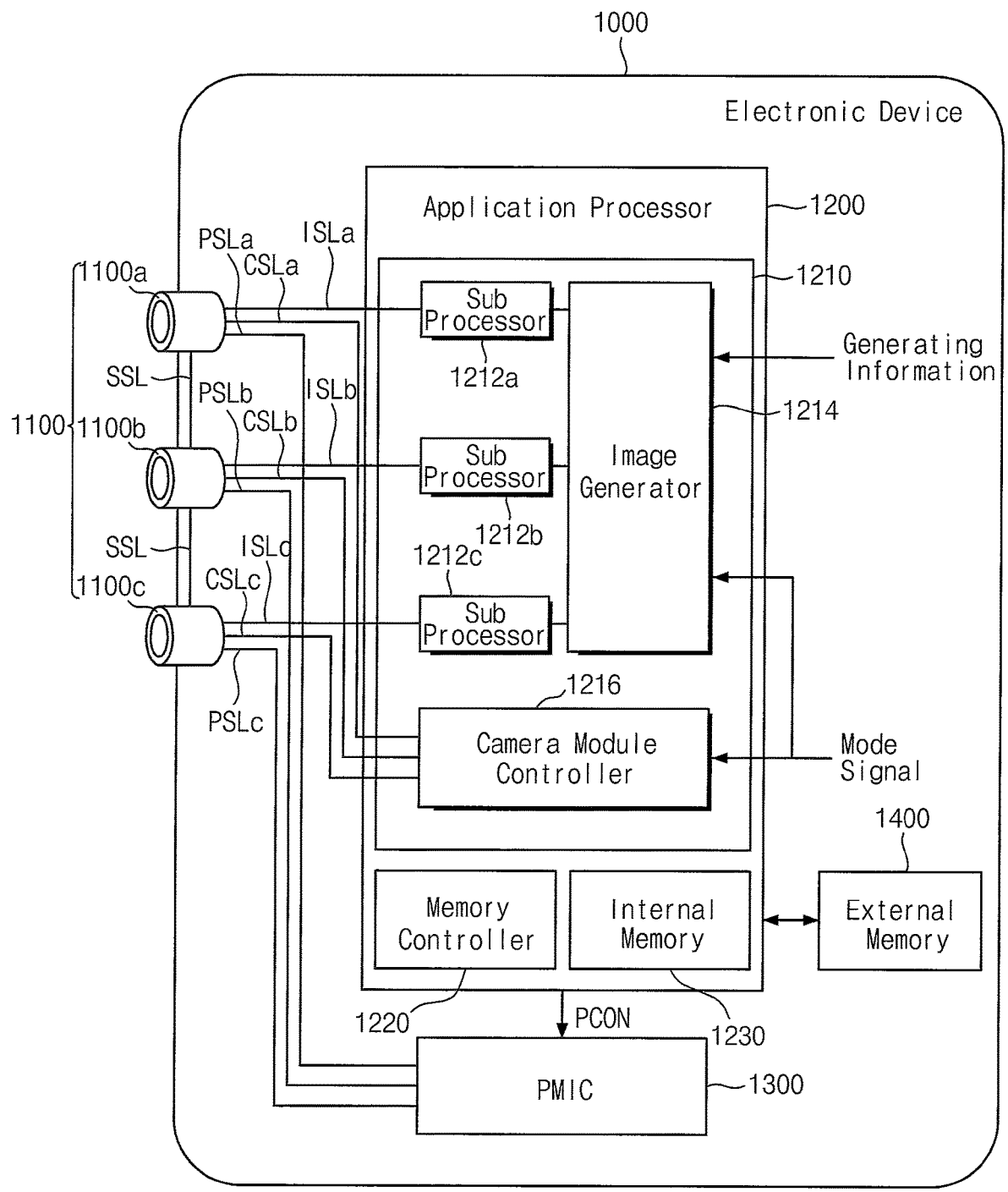
FIG. 38 is a block diagram illustrating an electronic device according to example embodiments.
Figure 39:
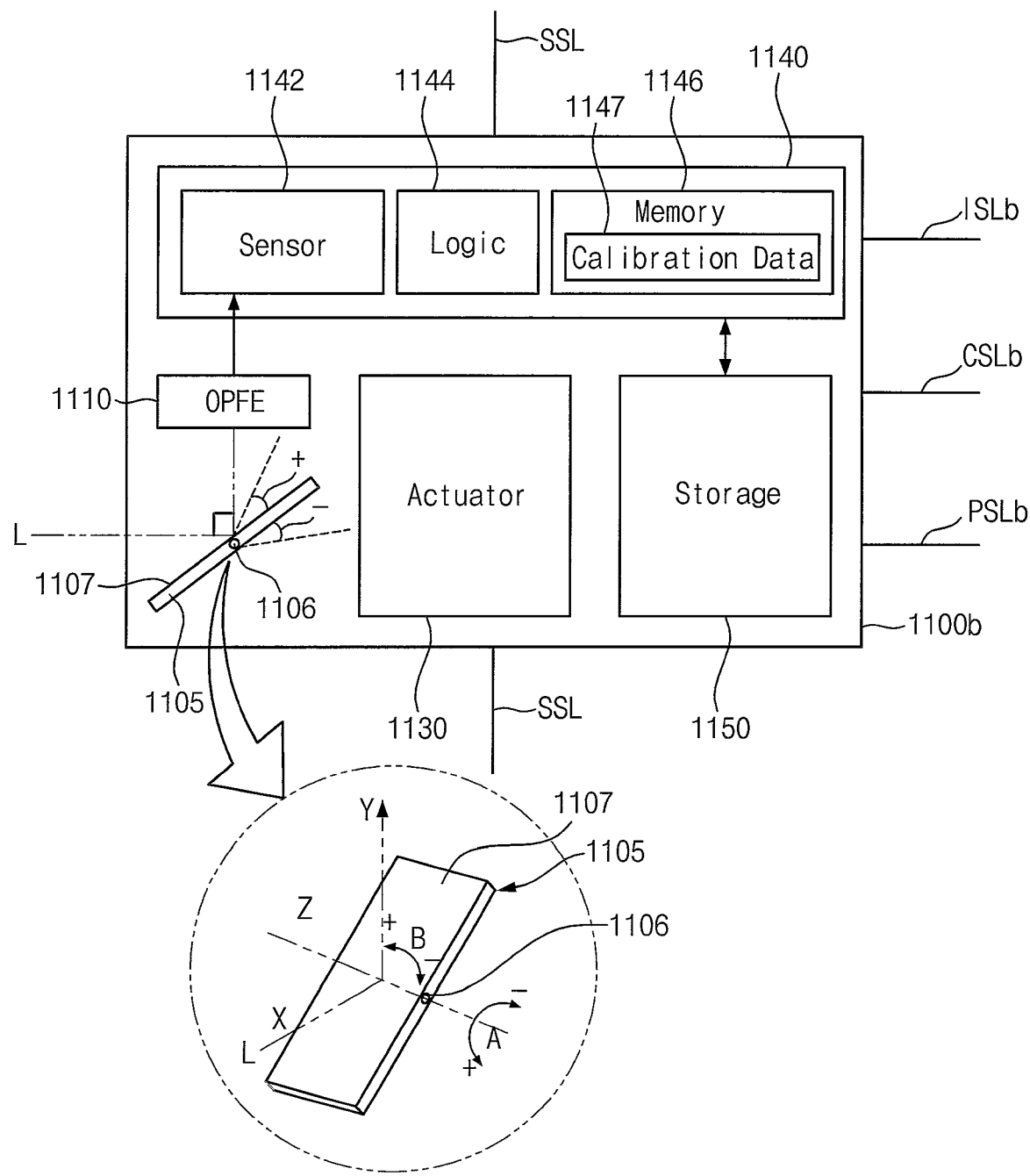
FIG. 39 is a block diagram illustrating a camera module included in the electronic device of FIG. 38.

FIG. 38 is a block diagram illustrating an electronic device according to example embodiments, and FIG. 39 is a block diagram illustrating a camera module included in the electronic device of FIG. 38.

Referring to FIG. 38, an electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. At least one of the camera modules 1100a, 1100b, and 1100c may include a multi-function ToF sensor as described above with reference to FIGS. 1 through 37. FIG. 38 illustrates three camera modules 1100a, 1100b, and 1100c as an example, but embodiments are not limited to a particular number of camera modules. According to other example embodiments, the camera module group 1100 may include, e.g., two camera modules, four or more camera modules, etc.

Hereinafter, an example configuration of the camera module 1100b is described with reference to FIG. 39. The same descriptions may be applied to one or more of the other camera modules 1100a and 1100c.

Referring to FIG. 39, the camera module 1100b may include a prism 1105, an optical path folding element (OPFE) 1110, an actuator 1130, an image sensing device 1140, and a storage device 1150.

The prism 1105 may include a reflection surface 1107 to change a path of a light L incident on the prism 1105.

In some example embodiments, the prism 1105 may change the path of the light L incident in a first direction X to the path in a second direction Y at an angle to, e.g., perpendicular to, the first direction X. The prism 1105 may rotate the reflection surface 1107 around a center axis 1106 and/or rotate the center axis 1106 in the B direction to align the path of the reflected light along the second direction Y.

In some example embodiments, a rotation angle of the prism 1105 may be smaller than 15 degrees in the positive (+) A direction and greater than 15 degrees in the negative (−) A direction, but embodiments are not limited thereto. The prism 1105 may rotate within 20 degrees in the positive B direction and the negative B direction, but embodiments are not limited thereto. The prism 1105 may move the reflection surface 1107 in the third direction Z that is in parallel with the center axis 1106.

The OPFE 1110 may move in a third direction perpendicular to the first direction X and the second direction Y. The OPFE 1110 may include optical lenses that are divided into m groups where m is a positive integer. The m lens groups may move in the second direction Y to change an optical zoom ratio of the camera module 1100b. For example, the optical zoom ratio may be changed in a range of 3K, 5K, and so on by moving the m lens groups, when K is a basic optical zoom ratio of the camera module 1100b.

The actuator 1130 may move the OPFE 1110 or the optical lenses to a specific position. For example, the actuator 1130 may adjust the position of the optical lenses for accurate sensing such that an image sensor 1142 may be located at a position corresponding to a focal plane of the optical lens.

The image sensing device 1140 may include an image sensor 1142, a control logic 1144, and a memory 1146. The image sensor 1142 may capture or sense an image using the light provided through the optical lens. The control logic 1144 may control overall operations of the camera module 1100b. For example, the control logic 1144 may provide control signals through a control signal line CSLb to control the operation of the camera module 1100b.

The memory 1146 may store information such as calibration data 1147 for the operation of the camera module 1100b. For example, the calibration data 1147 may include information for generation of image data based on the provided light, such as information on the above-described rotation angle, a focal length, information on an optical axis, and so on. When the camera module is implemented as a multi-state camera having a variable focal length depending on the position of the optical lens, the calibration data 1147 may include multiple focal length values and auto-focusing values corresponding to the multiple states.

The storage device 1150 may store the image data sensed using the image sensor 1142. The storage device 1150 may be disposed to receive an output of the image sensing device 1140, and the storage device 1150 may be stacked with a sensor chip including the image sensing device 1140. The storage device 1150 may be implemented with an electrically erasable programmable read-only memory (EEPROM), but embodiments are not limited thereto.

Referring to FIGS. 38 and 39, each of the camera modules 1100a, 1100b, and 1100c may include an actuator 1130. In this case, the camera modules 1100a, 1100b, and 1100c may include the same or different calibration data 1147 depending on the operations of the actuators 1130.

In some example embodiments, one camera module 1100b may have a folded lens structure included the above-described prism 1105 and the OPFE 1110, and the other camera modules 1100a and 1100b may have a vertical structure without the prism 1105 and the OPFE 1110.

In some example embodiments, one camera module 1100c may be a depth camera configured to measure distance information of an object using an infrared light. In this case, the application processor 1200 may merge the distance information provided from the depth camera 1100c and image data provided from the other camera modules 1100a and 1100b to generate a three-dimensional depth image.

In some example embodiments, at least two camera modules among the camera modules 1100a, 1100b, and 1100c may have different fields of view, e.g., through different optical lenses.

In some example embodiments, each of the camera modules 1100a, 1100b, and 1100c may be separated physically from each other. Thus, the camera modules 1100a, 1100b, and 1100c may each include a dedicated image sensor 1142.

The application processor 1200 may include an image processing device 1210, a memory controller 1220, and an internal memory 1230. The application processor 1200 may be separated from the camera modules 1100a, 1100b, and 1100c. For example, the application processor 1200 may be implemented as one chip, and the camera modules 1100a, 1100b, and 1100c may implemented as another chip or other chips.

The image processing device 1210 may include a plurality of sub processors 1212a, 1212b, and 1212c, an image generator 1214, and a camera module controller 1216.

The image data generated by the camera modules 1100a, 1100b, and 1100c may be provided to the sub processors 1212a, 1212b, and 1212c through distinct image signal lines ISLa, ISLb, and ISLc, respectively. For example, the transfer of the image data may be performed using a camera serial interface (CSI) based on mobile industry processor interface (MIPI), but embodiments are not limited thereto.

In some example embodiments, one sub processor may be assigned commonly to two or more camera modules. In this case, a multiplexer may be used to transfer the image data selectively from one of the camera modules to the shared sub processor.

The image data from the sub processors 1212a, 1212b, and 1212c may be provided to the image generator 1214. The image generator 1214 may generate an output image using the image data from the sub processors 1212a, 1212b, and 1212c according to image generating information or a mode signal. For example, the image generator 1214 may merge at least a portion of the image data from the camera modules 1100a, 1100b, and 1100c having the different fields of view to generate the output image according to the image generating information or the mode signal. The image generator 1214 may select, as the output image, one of the image data from the camera modules 1100a, 1100b, and 1100c according to the image generating information or the mode signal.

In some example embodiments, the image generating information may include a zoom factor or a zoom signal. The mode signal may be a signal based on a selection of a user.

When the image generating information is the zoom factor and the camera modules 1100a, 1100b, and 1100c have the different fields of view, the image generator 1214 may perform different operations depending on the zoom signal. For example, when (or based on) the zoom signal is a first signal, the image generator 1214 may merge the image data from the different camera modules to generate the output image. When the zoom signal is a second signal different from the first signal, the image generator 1214 may select, as the output image, one of image data from the camera modules 1100a, 1100b, and 1100c.

In some example embodiments, the image generator 1214 may receive the image data of different exposure times from the camera modules 1100a, 1100b, and 1100c. In this case, the image generator 1214 may perform high dynamic range (HDR) processing with respect to the image data from the camera modules 1100a, 1100b, and 1100c to generate the output image having the increased dynamic range.

The camera module controller 1216 may provide control signals to the camera modules 1100a, 1100b, and 1100c. The control signals generated by the camera module controller 1216 may be provided to the camera modules 1100a, 1100b, and 1100c through the distinct control signal lines CSLa, CSLb, and CSLc, respectively.

In some example embodiments, one of the camera modules 1100a, 1100b, and 1100c may be designated as a master camera according to the image generating information of the mode signal, and the other camera modules may be designated as slave cameras.

The camera module acting as the master camera may be changed according to the zoom factor or an operation mode signal. For example, when the camera module 1100a (e.g., first camera module) has the wider field of view than the camera module 1100b (e.g., second camera module) and the zoom factor indicates a lower zoom magnification, the camera module 1100b may be designated as the master camera. In contrast, when the zoom factor indicates a higher zoom magnification, the camera module 1100a may be designated as the master camera.

In some example embodiments, the control signals provided from the camera module controller 1216 may include a sync enable signal. For example, when the camera module 1100b is the master camera and the camera modules 1100a and 1100c are the slave cameras, the camera module controller 1216 may provide the sync enable signal to the camera module 1100b. The camera module 1100b may generate a sync signal based on the provided sync enable signal and provide the sync signal to the camera modules 1100a and 1100c through a sync signal line SSL. As such, the camera modules 1100a, 1100b, and 1100c may transfer the synchronized image data to the application processor 1200 based on the sync signal.

In some example embodiments, the control signals provided from the camera module controller 1216 may include information on the operation mode. The camera modules 1100a, 1100b, and 1100c may operate in a first operation mode or a second operation mode based on the information from the camera module controller 1216.

In the first operation mode, the camera modules 1100a, 1100b, and 1100c may generate image signals with a first speed (e.g., a first frame rate) and encode the image signals with a second speed higher than the first speed (e.g., a second frame rate higher than the first frame rate) to transfer the encoded image signals to the application processor 1200. The second speed may be less than thirty times the first speed. The application processor 1200 may store the encoded image signals in the internal memory 1230 or the external memory 1400. The application processor 1200 may read out and decode the encoded image signals to provide display data to a display device. For example, the sub processors 1212a, 1212b, and 1212c may perform the decoding operation, and the image generator 1214 may process the decoded image signals.

In the second operation mode, the camera modules 1100a, 1100b, and 1100c may generate image signals with a third speed lower than the first speed (e.g., the third frame rate lower than the first frame rate) to transfer the generated image signals to the application processor 1200. Thus, the image signals that are not encoded may be provided to the application processor 1200. The application processor 1200 may process the received image signals, or store the receive image signals in the internal memory 1230 or the external memory 1400.

The PMIC 1300 may provide a power supply voltage to the camera modules 1100a, 1100b, and 1100c, respectively. For example, the PMIC 1300 may provide, under control of the application processor 1200, a first power to the camera module 1100a through a power line PSLa, a second power to the camera module 1100b through a power line PSLb, and a third power to the camera module 1100c through a power line PSLc.

The PMIC 1300 may generate the power respectively corresponding to the camera modules 1100a, 1100b, and 1100c and control power levels, in response to a power control signal PCON from the application processor 1200. The power control signal PCON may include information on the power depending on the operation modes of the camera modules 1100a, 1100b, and 1100c. For example, the operation modes may include a low power mode in which the camera modules 1100a, 1100b, and 1100c operate with low power. The power levels of the camera modules 1100a, 1100b, and 1100c may be the same as or different from each other. The power levels may be changed dynamically or adaptively.

Embodiments may be applied to various electronic devices and systems including a ToF sensor. For example, embodiments may be applied to systems such as a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a vehicle navigation device, a video phone, a monitoring system, an auto focusing system, a tracking system, a motion detection system, etc.

By way of summation and review, among the three-dimensional cameras, a ToF (Time-of-Flight) sensor may have a simple circuit configuration and high distance resolution. The ToF sensor may illuminate an object with a transmission light using a light source, and calculate a distance to the object by measuring a phase difference of a flight time of a reception light reflected from the object using demodulation signals. Various electronic devices, including mobile phones, may include sensors having different functions, in addition to the ToF sensor, which may increase the sizes of the electronic devices.

As described above, embodiments may provide a depth pixel and a time-of-flight (ToF) sensor capable of various functions. The depth pixel and the ToF sensor may perform functions such as an auto focusing function, in addition to an original function of the ToF sensor to measure a distance, using the depth pixel including the plurality of photodiodes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A depth pixel of a time-of-flight (ToF) sensor formed in a semiconductor substrate, the depth pixel comprising:
   a first photodiode;
   a first tap disposed at a first side of the first photodiode in a first horizontal direction and configured to sample a photo charge stored in the first photodiode;
   a second tap disposed at a second side of the first photodiode in the first horizontal direction and configured to sample the photo charge stored in the first photodiode;
   a second photodiode disposed at a side of the first photodiode in a second horizontal direction perpendicular to the first horizontal direction;
   a third tap disposed at a first side of the second photodiode in the first horizontal direction and configured to sample a photo charge stored in the second photodiode;
   a fourth tap disposed at a second side of the second photodiode in the first horizontal direction and configured to sample the photo charge stored in the second photodiode; and
   a common microlens disposed above or below the semiconductor substrate, the common microlens covering both of the first photodiode and the second photodiode to focus an incident light to the first photodiode and the second photodiode,
   wherein the first photodiode, the first tap, and the second tap correspond to first sub depth pixel having a two-tap structure,
   wherein the second photodiode, the third tap, and the fourth tap correspond to a second sub depth pixel having the two-tap structure,
   wherein the first sub depth pixel and the second sub depth pixel are symmetric with respect to a first horizontal line passing through a center of the depth pixel and extending in the first horizontal direction, and
   wherein each of the first sub depth pixel and the second sub depth pixel is symmetric with respect to a second horizontal line passing through the center of the depth pixel and perpendicular to the first horizontal line.

2. The depth pixel as claimed in claim 1, further comprising a plurality of overflow gates coupled to the first photodiode and the second photodiode to drain the photo charge stored in the first photodiode and the second photodiode.

3. The depth pixel as claimed in claim 2, wherein:
   an overflow gate voltage applied to the plurality of overflow gates has a turn-off voltage level that causes draining of the photo charge to be blocked during an integration period, and
   at least two demodulation signals of different phases are applied to the first through fourth taps during the integration period.

4. The depth pixel as claimed in claim 3, wherein the overflow gate voltage has a turn-on voltage level to drain the photo charge stored in the first photodiode and the second photodiode during a reset period to initialize the depth pixel and during a readout period to measure an amount of the photo charge collected during the integration period.

5. The depth pixel as claimed in claim 1, wherein each of the first through fourth taps includes:
   a photogate to collect a photo charge in the first photodiode or the second photodiode in response to a demodulation signal;
   a demodulation transfer gate to transfer the photo charge collected by the photogate; and
   a floating diffusion region to store the photo charge transferred by the demodulation transfer gate.

6. The depth pixel as claimed in claim 5, wherein each of the first through fourth taps further includes a charge storing structure disposed between the demodulation transfer gate and the floating diffusion region, the charge storing structure being configured to temporarily store the photo charge transferred from a corresponding photodiode through the demodulation transfer gate before transferring the photo charge to the floating diffusion region.

7. The depth pixel as claimed in claim 1, wherein each of the first through fourth taps includes:
   a demodulation transfer gate to collect a photo charge in the first photodiode or the second photodiode in response to a demodulation signal, and transfer the photo charge in the first photodiode or the second photodiode; and
   a floating diffusion region to store the photo charge transferred through the demodulation transfer gate.

8. The depth pixel as claimed in claim 1, further comprising:
   a first common photogate disposed above the first photodiode to collect a photo charge in the first photodiode; and
   a second common photogate disposed above the second photodiode to collect a photo charge in the second photodiode, wherein each of the first through fourth taps includes:
a demodulation transfer gate to transfer the photo charge in the first photodiode or the second photodiode in response to a demodulation signal; and
a floating diffusion region to store the photo charge transferred through the demodulation transfer gate.

9. The depth pixel as claimed in claim 8, wherein a photogate voltage applied to the first common photogate and the second common photogate during an integration period has a direct current (DC) voltage level that causes collecting of the photo charge during the integration period.

10. The depth pixel as claimed in claim 1, further comprising:
a first floating diffusion region shared by the first tap and the third tap; and
a second floating diffusion region shared by the second tap and the fourth tap.

11. The depth pixel as claimed in claim 10, further comprising a conduction line disposed above the semiconductor substrate and electrically connecting the first floating diffusion region and the second floating diffusion region.

12. The depth pixel as claimed in claim 1, further comprising a middle gate disposed between the first photodiode and the second photodiode.

13. The depth pixel as claimed in claim 12, wherein a middle gate voltage applied to the middle gate during an auto focusing mode, which adjusts the focus of the incident light, has a turn-on voltage level to electrically connect the first photodiode and the second photodiode.

14. The depth pixel as claimed in claim 12, wherein a middle gate voltage applied to the middle gate during a distance measurement mode, which measures a distance to an object, has a turn-off voltage level to electrically disconnect the first photodiode and the second photodiode.

15. The depth pixel as claimed in claim 1, further comprising:
an anti-reflection layer disposed adjacent to a lower surface of the semiconductor substrate, the incident light being incident on the depth pixel through the lower surface of the semiconductor substrate;
a planarization layer disposed adjacent to a lower surface of the anti-reflection layer; and
a pixel isolation structure extending in a vertical direction perpendicular to the lower surface of the semiconductor substrate, and disposed in boundary regions of the depth pixel to block light from other depth pixels,
wherein the common microlens is disposed adjacent to a lower surface of the planarization layer.

16. The depth pixel as claimed in claim 15, further comprising a corrugated structure disposed adjacent to an upper surface of the anti-reflection layer and configured to induce reflection and scattering of light.

17. A time-of-flight (ToF) sensor, comprising:
a sensing unit including a depth pixel configured to provide information on a distance to an object based on an incident light that is reflected from the object; and
a controller configured to control the sensing unit,
wherein the depth pixel includes:
a first sub depth pixel including a first photodiode and first and second taps configured to sample a photo charge stored in the first photodiode;
a second sub depth pixel including a second photodiode and third and fourth taps configured to sample a photo charge stored in the second photodiode; and
a common microlens disposed above or below a semiconductor substrate that includes the first photodiode and the second photodiode, the common microlens covering both of the first photodiode and the second photodiode to focus the incident light to the first photodiode and the second photodiode,
wherein each of the first sub depth pixel and the second sub depth pixel has a two-tap structure,
wherein the first photodiode, the first tap, and the second tap are aligned in a first horizontal direction and the second photodiode, the third tap, and the fourth tap are aligned in a second horizontal direction perpendicular to the first horizontal direction,
wherein the first sub depth pixel and the second sub depth pixel are symmetric with respect to a first horizontal line passing through a center of the depth pixel and extending in the first horizontal direction, and
wherein each of the first sub depth pixel the sub depth pixel is symmetric with respect to a second horizontal line passing through the center of the depth pixel and extending in the second horizontal direction.

18. The ToF sensor as claimed in claim 17, wherein the ToF sensor is configured to perform an auto focusing operation, which adjusts the focus of the incident light, and a distance measurement operation, which measures a distance to the object, based on sample data provided from the first through fourth taps.

19. A depth pixel of a time-of-flight (ToF) sensor formed in a semiconductor substrate, the depth pixel comprising:
a first sub depth pixel including a first photodiode and first and second taps configured to sample a photo charge stored in the first photodiode;
a second sub depth pixel including a second photodiode and third and fourth taps configured to sample a photo charge stored in the second photodiode; and
a common microlens disposed above or below the semiconductor substrate, the common microlens covering both of the first photodiode and the second photodiode to focus an incident light to the first photodiode and the second photodiode,
wherein each of the first sub depth pixel and the second sub depth pixel has a two-tap structure,
wherein the first photodiode, the first tap, and the second sp are aligned in a first horizontal direction and the second photodiode, the third tap, and the fourth tap are aligned in a second horizontal direction perpendicular to the first horizontal direction,
wherein the first sub depth pixel and the second sub depth pixel are symmetric with respect to a first horizontal line passing through a center of the depth pixel and extending in the first horizontal direction, and
wherein each of the first sub depth pixel and the second sub depth pixel is symmetric with respect to a second horizontal line passing through the center of the depth pixel and extending in the second horizontal direction.

* * * * *